US012770698B2

(12) United States Patent
Lee

(10) Patent No.: US 12,770,698 B2

(45) Date of Patent: Oct. 20, 2026

(54) MEMORY DEVICE PERFORMING PROGRAM OPERATION AND METHOD OF OPERATING THE SAME

(71) Applicant: SK hynix Inc., Icheon-si Gyeonggi-do (KR)

(72) Inventor: Hee Youl Lee, Icheon-si Gyeonggi-do (KR)

(73) Assignee: SK hynix Inc., Icheon-si (KR)

(*) Notice: Subject to any disclaimer, the term of this patent is extended or adjusted under 35 U.S.C. 154(b) by 164 days.

(21) Appl. No.: 18/417,552

(22) Filed: Jan. 19, 2024

(65) Prior Publication Data

US 2025/0022521 A1 Jan. 16, 2025

(30) Foreign Application Priority Data

Jul. 12, 2023 (KR) ........................ 10-2023-0090382

(51) Int. Cl.

*G11C 16/34* (2006.01)

*G11C 16/10* (2006.01)

(52) U.S. Cl.

CPC ........ *G11C 16/3459* (2013.01); *G11C 16/102* (2013.01); *G11C 16/3404* (2013.01)

(58) Field of Classification Search

CPC .............. G11C 16/3459; G11C 16/102; G11C 16/3404; G11C 11/5628; G11C 16/0483; G11C 16/10; G11C 16/24; G11C 16/26; G11C 16/08

See application file for complete search history.

(56) References Cited

U.S. PATENT DOCUMENTS

2008/0253194 A1* 10/2008 Sim .................... G11C 16/3404 365/185.22

2011/0158000 A1* 6/2011 Cho ................... G11C 16/3459 365/185.22

2013/0308393 A1* 11/2013 Youn .................. G11C 16/3481 365/189.011

2015/0364208 A1* 12/2015 An ......................... G11C 16/12 365/185.22

2020/0143886 A1* 5/2020 Lee ....................... G06F 3/0659

2021/0391026 A1* 12/2021 Choi ...................... G11C 16/08

FOREIGN PATENT DOCUMENTS

KR 1020220159844 A 12/2022

KR 1020230020858 A 2/2023

* cited by examiner

*Primary Examiner* — Uyen Smet

(74) *Attorney, Agent, or Firm* — WILLIAM PARK AND ASSOCIATES LTD.

(57) ABSTRACT

A memory device according to the present technology includes a memory cell, a page buffer including a plurality of latches storing a result of comparing a threshold voltage of the memory cell with a pre-verify voltage and a main verify voltage, and, a program operation control circuit configured to control the page buffer to apply a first program control voltage to a bit line connected to the memory cell while a program voltage is applied to a word line connected to the memory cell based on the number of times pass data indicating that the threshold voltage of the memory cell exceeds the pre-verify voltage is sensed by the page buffer.

18 Claims, 15 Drawing Sheets

ΔVstep < mvfy − pvfy

FIG. 9

| | FIRST LATCH | SECOND LATCH | THIRD LATCH | FOURTH LATCH | BL1 |
|---|---|---|---|---|---|
| 1st loop | | | Fail | Fail | Vallow |
| 2nd loop | Fail | Fail | Pass | Fail | Vallow |
| 3rd loop | Pass | Fail | Pass | Pass | Vallow |
| 4th loop | Pass | Pass | Pass | Pass | Vinh |

FIG. 10

| | FIRST LATCH | SECOND LATCH | THIRD LATCH | FOURTH LATCH | BL2 |
|---|---|---|---|---|---|
| 1st loop | | | Fail | Fail | Vallow |
| 2nd loop | Fail | Fail | Pass | Fail | Vallow |
| 3rd loop | Pass | Fail | Pass | Fail | Vallow |
| 4th loop | Pass | Fail | Pass | Pass | Vctrl |
| 5th loop | Pass | Pass | Pass | Pass | Vinh |

MEMORY DEVICE PERFORMING PROGRAM OPERATION AND METHOD OF OPERATING THE SAME

CROSS-REFERENCE TO RELATED APPLICATION

The present application claims priority under 35 U.S.C. § 119 (a) to Korean patent application number 10-2023-0090382 filed on Jul. 12, 2023, in the Korean Intellectual Property Office, the entire disclosure of which is incorporated by reference herein.

BACKGROUND

1. Technical Field

The present disclosure relates to a memory device performing a program operation and a method of operating the same.

2. Related Art

A memory system is a device that stores data under control of a host device such as a computer or a smartphone. The memory system may include a memory device in which data is stored and a memory controller controlling the memory device.

Memory devices may be classified as either volatile or non-volatile.

A nonvolatile memory device is a device in which data is not lost even though power is cut off. Nonvolatile memory devices include read only memory (ROM), programmable ROM (PROM), electrically programmable ROM (EPROM), electrically erasable and programmable ROM (EEPROM), flash memory, and the like.

A memory device may perform a program operation of storing data. During the program operation, a threshold voltage of memory cells included in the memory device may increase. The memory device may apply a program allowable voltage to a bit line connected to a memory cell of which a threshold voltage applied to the bit line is increased. The memory device may also apply a program inhibit voltage to a bit line connected to a memory cell, which is not to be programmed.

SUMMARY

An embodiment of the present disclosure provides a memory device and a method of operating the memory device, which improves a threshold voltage distribution of memory cells during a program operation.

According to an embodiment of the present disclosure, a memory device includes a memory cell, a page buffer including a plurality of latches, which store a result of comparing a threshold voltage of a memory cell with a pre-verify voltage and a main verify voltage. The memory device also includes a program operation control circuit configured to control the page buffer to cause the page buffer to apply a first program control voltage to a bit line connected to the memory cell while a program voltage is applied to a word line connected to the memory cell based on the number of times pass data indicating that the threshold voltage of the memory cell exceeds the pre-verify voltage is sensed by the page buffer.

According to an embodiment of the present disclosure, a memory device includes a memory cell, a first pre-sensing latch configured to store fail data indicating a result of a pre-verify operation on the memory cell in a first program loop, a second pre-sensing latch configured to store pass data indicating a result of the pre-verify operation on the memory cell in a second program loop, a voltage generation circuit configured to generate a voltage to be applied to a word line and a bit line connected to the memory cell, and a program operation control circuit configured to control the voltage generation circuit to apply a voltage to a bit line connected to the memory cell in a third program loop according to whether the data stored in the first pre-sensing latch and the second pre-sensing latch match each other.

According to another embodiment of the present disclosure, a memory device includes memory cells, a peripheral circuit configured to perform a program operation, which stores data in the memory cells, a voltage generation circuit configured to generate a program voltage to be applied to a word line commonly connected to the memory cells for each of a plurality of program loops included in the program operation, and bit line voltages to be applied to bit lines respectively connected to the memory cells while the program voltage is applied to the word line, and a program operation control circuit configured to control the voltage generation circuit to apply the bit line voltages having different sizes to the bit lines according to the number of times a threshold voltage of the memory cells is identified as a threshold voltage greater than a pre-verify voltage.

According to another embodiment of the present disclosure, a method of operating a memory device includes applying a program voltage to a word line connected to a memory cell in a first program loop, identifying a threshold voltage of the memory cell using a pre-verify voltage in the first program loop, and applying a bit line voltage to a bit line connected to the memory cell in a second program loop according to the number of times the threshold voltage of the memory cell is identified as a threshold voltage greater than the pre-verify voltage.

According to the present technology, a memory device and a method of operating the same capable of improving a threshold voltage distribution of memory cells during a program operation are provided.

BRIEF DESCRIPTION OF THE DRAWINGS

FIG. 9 is a chart illustrating an embodiment of data stored in a plurality of latches during the program operation.

FIG. 10 is a chart illustrating another embodiment of the data stored in the plurality of latches during the program operation.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and should not be construed as being limited to the embodiments described in the present specification or application.

Figure 1:
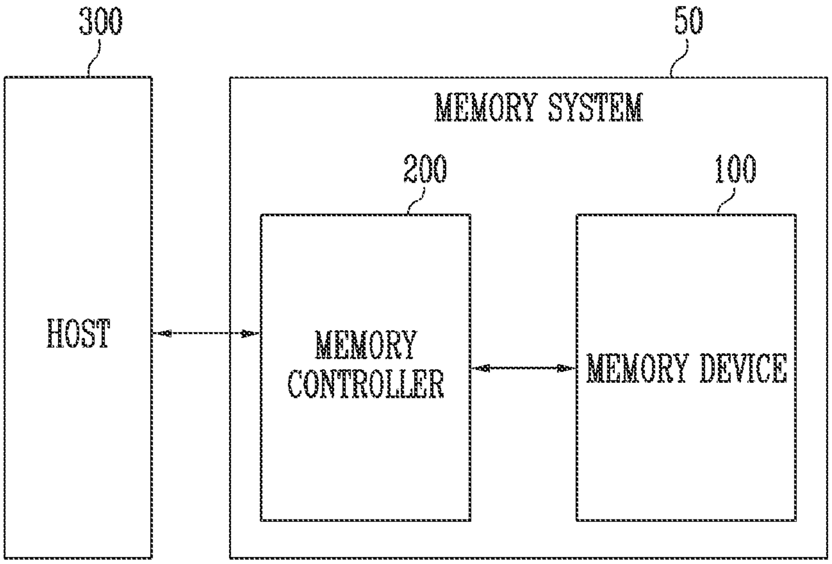
FIG. 1 is a block diagram illustrating a memory system including a memory device.

FIG. 1 is a block diagram illustrating a memory system including a memory device.

Referring to FIG. 1, the memory system 50 may include the memory device 100 and a memory controller 200. The memory system 50 may include a memory device 100 and a memory controller 200. The memory system may store data under control of a host 300, which is an external device. The memory system 50 may be included in various electronic devices such as a computer, a server, and an automobile as well as a mobile device such as a mobile phone, a tablet PC, and a wearable device.

The memory system 50 may be comprised of various types of data storage devices such as a solid state drive (SSD) and a universal flash storage (UFS) according to a host interface, which is a communication method with the host 300. The memory system 50 may be manufactured as various types of package types such as a system on chip (SOC).

The memory device 100 may store data. The memory device 100 may operate in response to control signals it receives from the memory controller 200. In an embodiment, the memory device 100 may be either a non-volatile memory device or a volatile memory device. In the present specification, it is assumed that the memory device 100 is a NAND flash memory, which is non-volatile.

The memory device 100 may receive a command and an address from the memory controller 200 and may perform an operation that corresponds to the command with respect to an area selected by the address. More specifically, the memory device 100 may receive a program command, which will cause the memory device 100 to perform a program operation (write operation) of storing data in an area selected by the address. The memory device 100 may receive a read command, which will cause the memory device 100 to perform a read operation of reading data. The memory device 100 may also receive an erase command, which will cause the memory device 100 to perform an erase operation of deleting data.

The memory controller 200 may control an overall operation of the memory system 50.

When power is applied to the memory system 50, the memory controller 200 may execute stored program instructions for a processor, which are commonly known as firmware (FW). In an embodiment, a processor in the memory controller 200 may execute firmware to control communication between the host 300 and the memory device 100. In an embodiment, the firmware in the memory controller 200 may cause the memory controller 200 to convert a logical address of the host into a physical address of the memory device 100.

The memory controller 200 may control the memory device 100 to cause the memory device 100 to perform the program operation, the read operation, the erase operation, or the like according to a request of the host 300. The memory controller 200 may provide a command, a physical address, or data to the memory device 100 according to the program operation, the read operation, or the erase operation.

In an embodiment, the memory controller 200 may generate a command, an address, and data independently regardless of the request from the host 300 and transmit the command, the address, and the data to the memory device 100. For example, the memory controller 200 may provide the command, the address, and the data for performing the program operation, the read operation, and the read operation required in performing a background operation such as wear leveling, read reclaim, or garbage collection, to the memory device 100.

In an embodiment, the memory controller 200 may control two or more memory devices 100. In such a case, the memory controller 200 may control the two or more memory devices 100 using interleaving method to improve operation performance. The interleaving method may be a method of controlling overlap internal operations of at least two memory devices 100.

Figure 2:
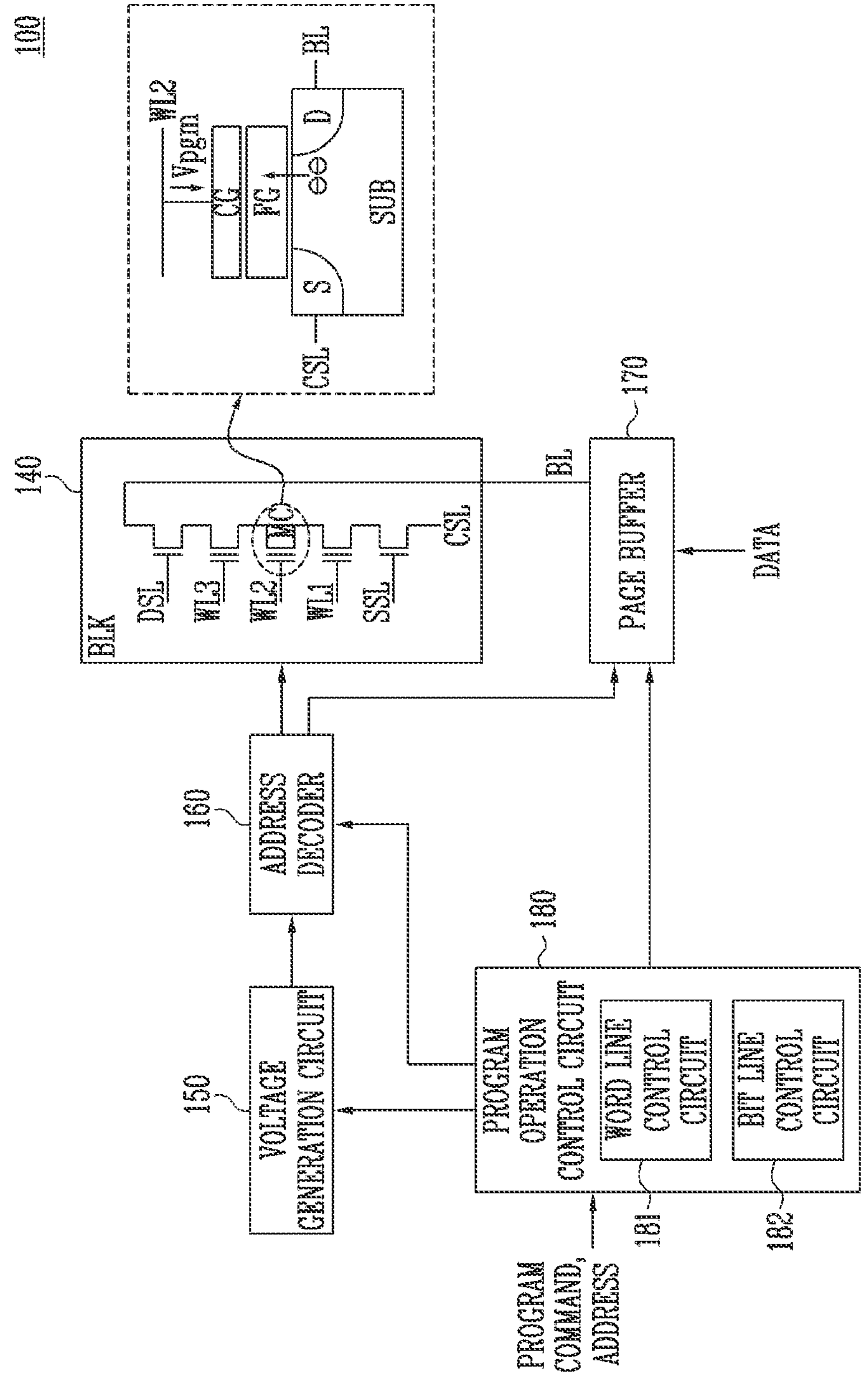
FIG. 2 is a diagram illustrating a program operation of the memory device.

FIG. 2 is a diagram illustrating the program operation of the memory device.

Referring to FIG. 2, the memory device 100 may include a memory block 140, a voltage generation circuit 150, an address decoder 160, a page buffer 170, and a program operation control circuit 180. The program operation control circuit 180 may include a word line control circuit 181 and a bit line control circuit 182. The memory block 140 may include a plurality of memory cells connected to a plurality of word lines WL1 to WL3. The memory block 140 may be connected to the address decoder 160 and the page buffer 170.

In an embodiment, the program operation control circuit 180 may receive a program command and an address from the memory controller 200. The page buffer 170 may receive data from the memory controller 200. The program operation control circuit 180 may control the voltage generation circuit 150, the address decoder 160, and the page buffer 170 to perform a program operation on a plurality of memory cells in response to the program command. The program operation may be an operation of storing data in the plurality of memory cells.

In an embodiment, the word line control circuit 181 may control the voltage generation circuit 150 to generate operation voltages used for the program operation. The operation voltages may include a program voltage and a pass voltage applied to the plurality of word lines. The operation voltages may include bit line voltages applied to bit lines. The bit line voltages may include a program allowable voltage, a program control voltage, and a program inhibit voltage. The voltage generation circuit 150 may generate the operation voltages and provide the operation voltages to the address decoder 160.

In an embodiment, the word line control circuit 181 may provide the address received from the memory controller to the address decoder 160. The address decoder 160 may select a word line to which the program voltage is applied among the plurality of word lines WL1 to WL3 based on the address. The address decoder 160 may apply the program voltage to the selected word line among the plurality of word lines WL1 to WL3 and apply the pass voltage to unselected word lines. The address decoder 160 may provide the bit line voltages to the page buffer 170.

In an embodiment, the bit line control circuit 182 may control the voltage generation circuit 150, the address decoder 160, and the page buffer 170 to apply the program allowable voltage, the program control voltage, or the program inhibit voltage to the bit line BL.

In an embodiment, the bit line control circuit 182 may control the voltage generation circuit 150, the address decoder 160, and the page buffer 170 to apply the program allowable voltage or the program control voltage to a bit line BL connected to a memory cell of which a threshold voltage is to be increased. In an embodiment, the program allowable voltage may be a ground or reference potential voltage. The program control voltage may be greater than the program allowable voltage but less than the program inhibit voltage. The program inhibit voltage may be a low-power voltage, i.e. a low voltage that reduces the memory device's overall power consumption without inhibiting its operation. The threshold voltage of the memory cell may increase more when a program allowable voltage is applied to the bit line BL connected to the memory cell than when a program control voltage is applied to the bit line BL connected to the memory cell.

In an embodiment, the bit line control circuit 142 may control the voltage generation circuit 150, the address decoder 160, and the page buffer 170 to apply the program inhibit voltage to a bit line BL connected to a memory cell of which a threshold voltage is not to be increased.

For example, the address decoder 160 may select a second word line WL2 among the plurality of word lines WL1 to WL3 based on the address received from the program operation control circuit 180. The address decoder 160 may apply the program voltage to the second word line WL2.

A control gate CG of the memory cell may be connected to the second word line WL2. The program voltage applied to the second word line WL2 may be transferred to the control gate CG of the memory cell. When the program voltage is applied to the control gate CG of the memory cell, a channel may be formed between a source side S and a drain side D of the memory cell. When the channel is formed in the memory cell, charges may flow into a floating gate FG. When the charges flow into the floating gate FG, the threshold voltage of the memory cell may increase. The threshold voltage of the memory cell may thus be increased by the program operation.

Figure 3:
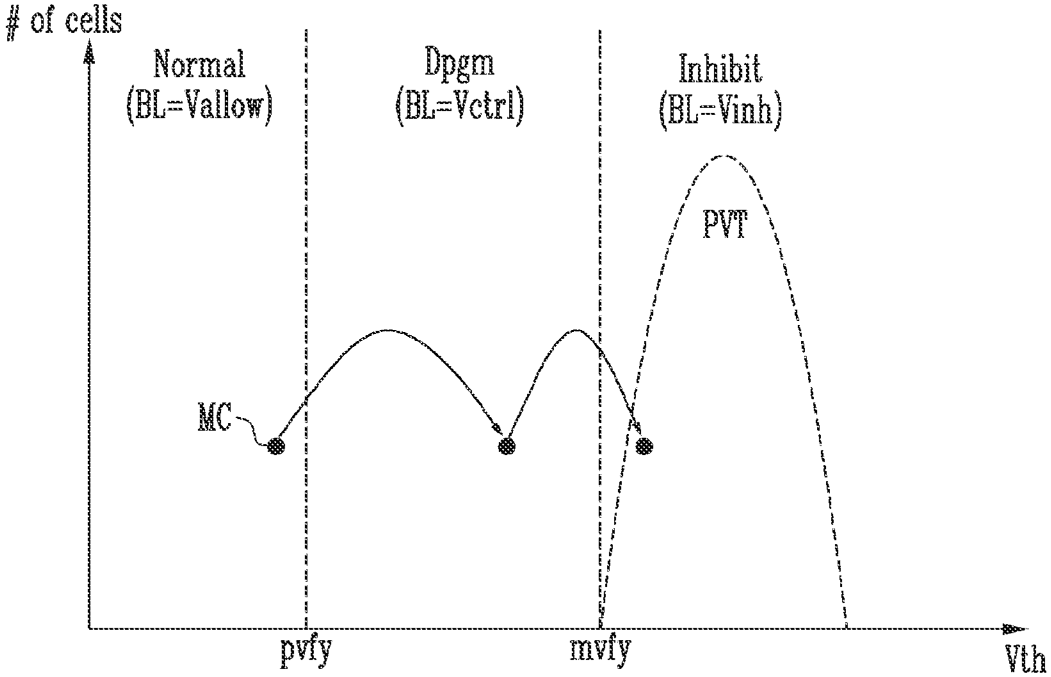
FIG. 3 is a diagram illustrating a double verify program operation.

FIG. 3 is a graph illustrating a double verify program operation.

In FIG. 3, the horizontal axis of the graph represents a threshold voltage Vth of memory cells. The vertical axis of the graph represents the number of memory cells, i.e., # of cells.

Referring to FIG. 3, the memory device 100 may perform a program operation so that the threshold voltage Vth of the memory cell MC is increased to a threshold voltage Vth corresponding to a target program state PVT.

In an embodiment, the memory device 100 may perform a double verify program operation of identifying whether the threshold voltage Vth of the memory cell MC is increased to the threshold voltage Vth corresponding to the target program state PVT using at least two or more verify voltages. The two or more verify voltages may include a pre-verify voltage pvfy and a main verify voltage mvfy. The memory device 100 may perform a pre-verify operation of identifying whether the threshold voltage Vth of the memory cell MC is greater than the pre-verify voltage pvfy. The memory device 100 may perform a main verify operation of identifying whether the threshold voltage Vth of the memory cell MC is greater than the main verify voltage mvfy.

In an embodiment, a section in which the threshold voltage Vth of the memory cell MC is less than the pre-verify voltage pvfy may be a normal region Normal. In the normal region, the memory device 100 may apply a program allowable voltage Vallow to the bit line BL connected to the memory cell MC.

In an embodiment, a section in which the threshold voltage Vth of the memory cell MC exceeds the pre-verify voltage pvfy and is equal to or less than the main verify voltage mvfy may be a Dpgm region Dpgm. In the Dpgm region, the memory device 100 may apply a program control voltage Vctrl to the bit line BL connected to the memory cell MC. The program control voltage Vctrl may be greater than the program allowable voltage Vallow. The amount by which the threshold voltage of the memory cell MC increases in a case where the program control voltage Vctrl is applied to the bit line BL may be less than the amount by which the threshold voltage Vth of the memory cell MC increases in a case where the program allowable voltage Vallow is applied to the bit line BL.

In an embodiment, a section in which the threshold voltage Vth of the memory cell exceeds the main verify voltage mvfy may be a program inhibit region Inhibit. In the program inhibit region, the memory device 100 may apply a program inhibit voltage Vinh to the bit line BL connected to the memory cell MC. When the program inhibit voltage Vinh is applied to the bit line BL, the threshold voltage Vth of the memory cell MC may not increase.

In an embodiment, the memory device 100 may adjust the amount by which the threshold voltage Vth of the memory cell MC increases by adjusting the voltage to be applied to the bit line BL connected to the memory cell MC. The memory device 100 may form a narrower threshold voltage distribution of the target program state PVT by reducing the amount by which the threshold voltage Vth of the memory cell MC increases in the Dpgm region to be less than the amount by which the threshold voltage Vth of the memory cell MC increases in the normal region. However, when the amount by which the threshold voltage Vth of the memory cell MC increases during the program operation is small, a time required for the threshold voltage Vth of the memory cell MC to increase to the threshold voltage Vth corresponding to the target program state PVT may be increased.

Figure 4:
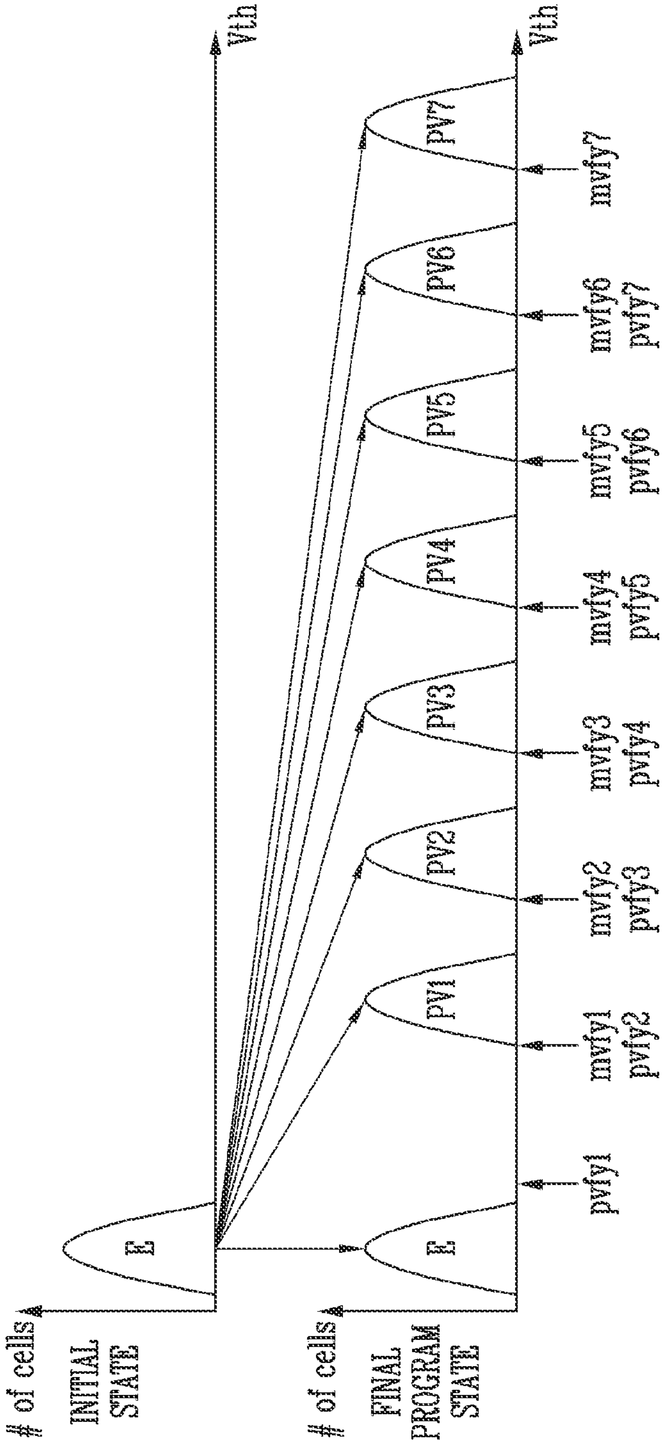
FIG. 4 is a diagram illustrating a threshold voltage distribution of memory cells according to the program operation.

FIG. 4 is a graph illustrating a threshold voltage distribution of the memory cells according to the program operation.

In FIG. 4, the horizontal axis of the graph represents a threshold voltage Vth of the memory cells. The vertical axis of the graph represents the number of memory cells (# of cells). In FIG. 4, the case where one memory cell is programmed with a TLC storing three bits of data is described as an example.

Referring to FIG. 4, the threshold voltage distribution of the memory cells may change from an initial state to a final program state responsive to the program operation.

The initial state may be a state in which the program operation is not performed, and the threshold voltage distribution of the memory cells may be in an erase state E.

The final program state may be a threshold voltage distribution of memory cells on which the program operation is performed. The threshold voltage Vth of the memory cells may increase to a threshold voltage Vth corresponding to any one of a plurality of program states according to the program operation. For example, when one memory cell is programmed with a TLC storing three bits of data, the one memory cell may increase to a threshold voltage Vth corresponding to the erase state E and any one of first to seventh program states PV1 to PV7.

Each of the memory cells may have the erase state E and any one of the first to seventh program states PV1 to PV7 as a target program state. The target program state may be determined according to data to be stored in the memory cell. Each of the memory cells may increase to a threshold voltage Vth corresponding to the target program state among the erase state E and the first to seventh program states PV1 to PV7 according to data to be stored.

In an embodiment, the memory device 100 may identify whether the threshold voltage Vth of the memory cells increases to the threshold voltage Vth corresponding to the target program states using the pre-verify voltage and the main verify voltage. In an embodiment, the memory device 100 may perform a pre-verify operation and a main verify operation of identifying whether the threshold voltage of the memory cells increase to a threshold voltage corresponding to the first program state PV1 using a first pre-verify voltage pvfy1 and a first main verify voltage mvfy1.

In an embodiment, first to seventh main verify voltages mvfy1 to mvfy7 may be voltages respectively corresponding to the first to seventh program states PV1 to PV7. The main verify voltage may be a voltage for identifying whether the threshold voltage of the memory cell increase to the threshold voltage corresponding to the target program state.

In an embodiment, second to seventh pre-verify voltages pvfy2 to pvfy7 may be voltages respectively corresponding to the first to sixth program states PV1 to PV6. The pre-verify voltage may be a voltage for identifying whether the threshold voltage of the memory cell exceeds the pre-verify voltage.

In an embodiment, a size of the first main verify voltage mvfy1 and a magnitude of the second pre-verify voltage pvfy2 may be the same. The memory device 100 may simultaneously perform a main verify operation on first memory cells having the first program state as the target program state among the memory cells and a pre-verify operation on second memory cells having the second program state as the target program state among the memory cells by using the first main verify voltage mvfy1 having the same size as the second pre-verify voltage pvfy2. In an embodiment, during the program operation, the memory device 100 may reduce a time required for identifying the threshold voltage of the memory cells by setting a size of the first main verify voltage mvfy1 and a size of the second pre-verify voltage pvfy2 to be the same.

Figure 5:
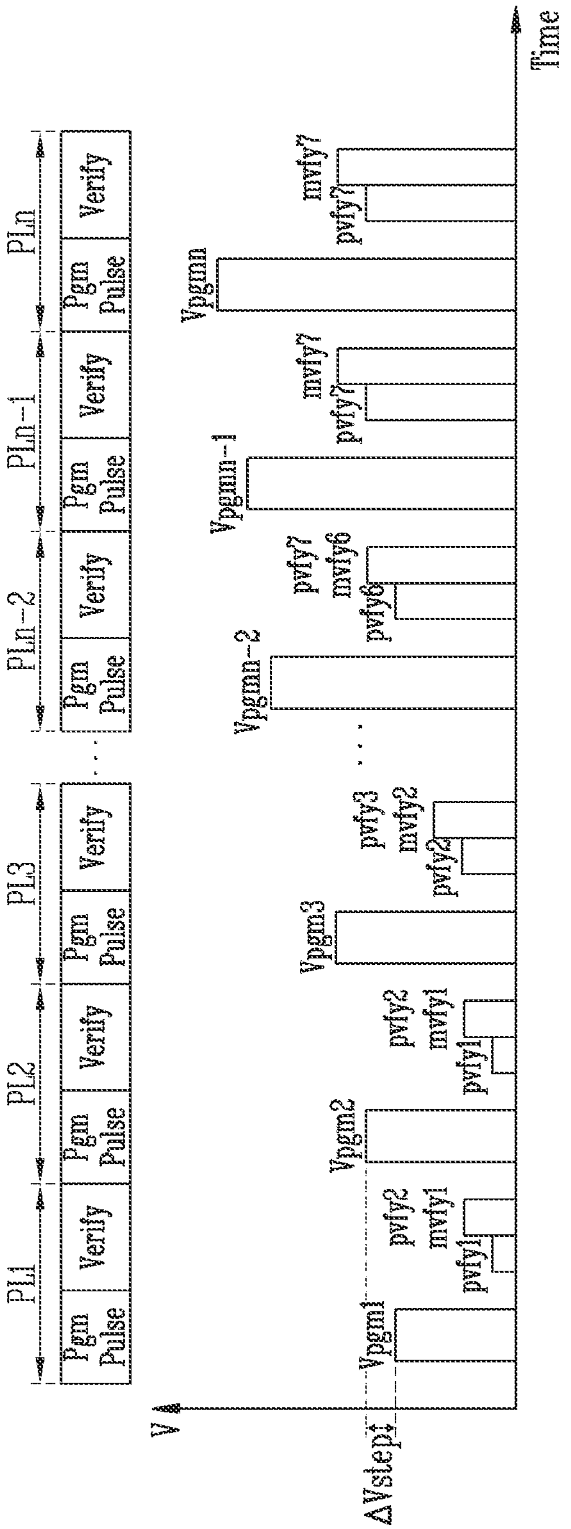
FIG. 5 is a diagram illustrating a program operation including a plurality of program loops.

FIG. 5 is a diagram illustrating a program operation including a plurality of program loops.

In FIG. 5, the horizontal axis of the diagram represents time. The vertical axis of the diagram represents voltage V applied to a word line. The voltage V applied to the word line may include the program voltage Vpgm, the pre-verify voltage pvfy, and the main verify voltage mvfy.

Referring to FIG. 5, the memory device 100 may perform the program operation. The program operation may include the plurality of program loops PL1 to PLn. The memory device 100 may perform the plurality of program loops PL1 to PLn so that a threshold voltage Vth of each of selected memory cells connected to the selected word line has the threshold voltage Vth corresponding to the target program state.

Each of the plurality of program loops PL1 to PLn may include a program voltage apply operation Pgm Pulse and a verify operation Verify.

The program voltage apply operation Pgm Pulse may be an operation of applying the program voltage to the selected word line to which the selected memory cells are connected. The program voltage apply operation Pgm Pulse may be an operation of increasing the threshold voltage Vth of the selected memory cells by using the program voltage.

The verify operation Verify may be an operation of identifying a threshold voltage Vth of memory cells, which is increased by the program voltage apply operation. The verify operation verify may be an operation of applying the pre-verify voltage pvfy and the main verify voltage mvfy to the selected word line to which the selected memory cells are connected. The verify operation Verify may include the pre-verify operation of identifying the threshold voltage Vth of the selected memory cells using the pre-verify voltage pvfy and the main verify operation of identifying the threshold voltage Vth of the selected memory cells using the main verify voltage mvfy.

Specifically, the verify operation verify may be an operation of obtaining data sensed through a bit line connected to the selected memory cells when the pre-verify voltage pvfy or the main verify voltage mvfy is applied to the selected word line to which the selected memory cells are connected.

In an embodiment, during the verify operation Verify, when the threshold voltage Vth of the selected memory cells exceed the pre-verify voltage pvfy, pass data indicating that the pre-verify operation is passed may be sensed. During the verify operation Verify, when the threshold voltage of the selected memory cells exceed the main verify voltage mvfy, pass data indicating that the main verify operation is passed may be sensed.

In an embodiment, during the verify operation Verify, when the threshold voltage Vth of the selected memory cells is equal to or less than the pre-verify voltage pvfy, fail data indicating that the pre-verify operation is failed may be sensed. During the verify operation Verify, when the threshold voltage Vth of the selected memory cells is equal to or less than the main verify voltage mvfy, fail data indicating that the main verify operation is failed may be sensed.

In an embodiment, in the first program loop PL1, the memory device 100 may apply the first program voltage Vpgm1 to the selected word line to which the selected memory cells are connected, and then apply the first pre-verify voltage pvfy1 and the first main verify voltage mvfy1. The first main verify voltage mvfy1 may be a voltage corresponding to the first program state. In the first program loop PL1, the memory device 100 may identify a threshold voltage of the first memory cells having the first program state as the target program state among the selected memory cells by using the first pre-verify voltage pvfy1 and the first main verify voltage mvfy1.

In an embodiment, as described with reference to FIG. 4, the size of the first main verify voltage mvfy1 and the size of the second pre-verify voltage pvfy2 may be the same. In the first program loop PL1, the memory device 100 may identify whether a threshold voltage of the second memory cells having the second program state as the target program state among the selected memory cells exceeds the second pre-verify voltage pvfy2 by applying the second pre-verify voltage pvfy2.

In an embodiment, in the verify operation Verify of the first program loop PL1, when the threshold voltage of the selected memory cells is equal to or less than the first pre-verify voltage pvfy1, the pre-verify operation may be failed. In the first program loop PL1, when the threshold voltage of the selected memory cells is equal to or less than the first main verify voltage mvfy1, the main verify operation may be failed.

Thereafter, in the program voltage apply operation Pgm Pulse of the second program loop PL2, the memory device 100 may apply the second program voltage Vpgm2 to the selected word line. The second program voltage Vpgm2 may be a voltage greater than the first program voltage Vpgm1 by a step voltage ΔVstep.

In the verify operation Verify of the second program loop PL2, the memory device 100 may apply the first pre-verify voltage pvfy1 and the first main verify voltage mvfy1 to the selected word line. In an embodiment, when the threshold voltage of the selected memory cells exceeds the first pre-verify voltage pvfy1, the pre-verify operation may be passed. When the threshold voltage of the selected memory cells exceeds the first main verify voltage mvfy1, the main verify operation may be passed.

When the pre-verify operation and the main verify operation using the first pre-verify voltage pvfy1 and the first main verify voltage mvfy1 is passed, it may be identified that the threshold voltage of the first memory cells having the first program state as the target program state among the selected memory cells reaches the first program state.

Thereafter, in the program voltage apply operation Pgm Pulse of the third program loop PL3, the memory device 100 may apply the third program voltage Vpgm3 greater than the second program voltage Vpgm2 by the step voltage to the selected word line. In addition, in the program voltage apply operation Pgm Pulse of the third program loop PL3, the memory device 100 may apply the second pre-verify voltage pvfy2 and the second main verify voltage mvfy2 to the selected word line. In the verify operation Verify of the third program loop PL3, the memory device 100 may identify the threshold voltage of the second memory cells having the second program state as the target program state among the memory cells using the second pre-verify voltage pvfy2 and the second main verify voltage mvfy2.

Similarly to this, in the verify operation Verify, the memory device 100 may identify whether the selected memory cells respectively increase to the threshold voltages corresponding to the third to seventh program states using the third to seventh pre-verify voltages pvfy3 to pvfy7 and the third to seventh main verify voltages mvfy3 to mvfy7.

In an embodiment, in the verify operation Verify of the n-th program loop PLn, the pre-verify operation and the main verify operation on the memory cells having the seventh program state as the target program state may be passed. When the pre-verify operation and the main verify operation for the seventh program state is passed, the memory device 100 may determine that the threshold voltage of the selected memory cells increases to the threshold voltage corresponding to each target program state. When the pre-verify operation and the main verify operation for the seventh program state is passed, performance of the program operation may be completed.

In an embodiment, the program voltage may be determined according to an incremental step pulse programming (ISPP) method. A size of the program voltage may gradually increase or decrease as the plurality of program loops PL1 to PLn are repeated. The number of times the program voltages used in each program loop are applied, a voltage level of the program voltages, a time when the program voltages are applied, and the like may be determined in various forms under control of the memory controller 200.

In FIG. 5, a case where one pre-verify voltage and one main verify voltage are applied to the selected word line in the verify operation of one program loop is described as an example. In an embodiment, the memory device 100 may apply two or more pre-verify voltages and two or more main verify voltages to the selected word line in the verify operation of one program loop. For example, in the verify operation Verify of the second program loop PL2, the memory device 100 may apply the first pre-verify voltage pvfy1 and the first main verify voltage mvfy1 to the selected word line.

Figure 6:
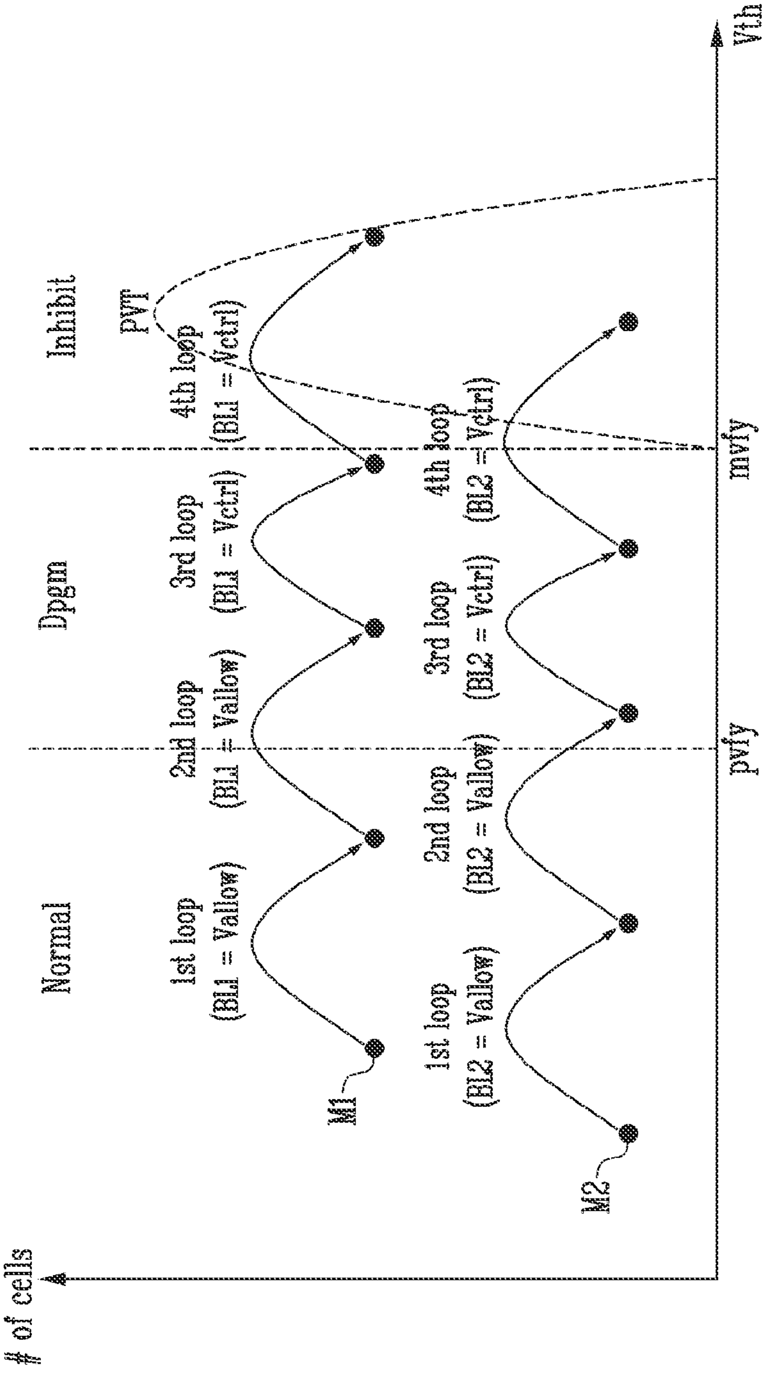
FIG. 6 is a diagram illustrating a threshold voltage of the memory cells increasing during the double verify program operation.

FIG. 6 is a diagram illustrating the threshold voltage of the memory cells increasing during the double verify program operation.

In FIG. 6, a horizontal axis of a graph represents the threshold voltage Vth of the memory cells, and a vertical axis of the graph represents the number of memory cells # of cells.

The target program state PVT shown in FIG. 6 may be any one of the first to seventh program states PV1 to PV7 shown in FIG. 4. A first memory cell M1 and a second memory cell M2 may increase to the threshold voltage corresponding to the target program state PVT during the program operation.

In an embodiment, in a first loop $1^{st}$ loop, the memory device 100 may apply the program allowable voltage Vallow to a first bit line to which the first memory cell M1 is connected and a second bit line to which the second memory cell M2 is connected, and apply the program voltage to a word line connected to the first memory cell M1 and the second memory cell M2.

In the first loop $1^{st}$ loop, the threshold voltage of the first memory cell M1 and the second memory cell M2 may be less than the pre-verify voltage pvfy and the main verify voltage mvfy. That is, in the first loop $1^{st}$ loop, the pre-verify operation and the main verify operation on each of the first memory cell M1 and the second memory cell M2 may be failed.

In a second loop $2^{nd}$ loop, the memory device 100 may apply the program allowable voltage Vallow to the first bit line to which the first memory cell M1 is connected and the second bit line to which the second memory cell M2 is connected, and apply the program voltage to the word line connected to the first memory cell M1 and the second memory cell M2. The program voltage may increase by the step voltage for each loop.

In an embodiment, in the second loop $2^{nd}$ loop, the threshold voltage of the first memory cell M1 and the second memory cell M2 may be greater than the pre-verify voltage pvfy and less than the main verify voltage mvfy. That is, in the second loop $2^{nd}$ loop, the pre-verify operation on each of the first memory cell M1 and the second memory cell M2 may be passed, and the main verify operation may be failed.

Thereafter, in a third loop $3^{rd}$ loop, the memory device 100 may apply a program control voltage Vctrl to the first bit line to which the first memory cell M1 is connected and the second bit line to which the second memory cell M2 is connected, and apply the program voltage to the word line connected to the first memory cell M1 and the second memory cell M2. Since the program control voltage Vctrl is greater than the program allowable voltage Vallow, a degree by which the threshold voltage of the first memory cell M1 and the second memory cell M2 increases in the third loop $3^{rd}$ loop may be less than a degree by which the threshold voltage of the first memory cell M1 and the second memory cell M2 increases in the second loop $2^{nd}$ loop.

In an embodiment, in the third loop $3^{rd}$ loop, the threshold voltage of the first memory cell M1 and the second memory cell M2 may be greater than the pre-verify voltage pvfy and less than the main verify voltage mvfy. That is, in the third loop $3^{rd}$ loop, the pre-verify operation on each of the first memory cell M1 and the second memory cell M2 may be passed, and the main verify operation may be failed.

In an embodiment, a difference between the main verify voltage mvfy and the pre-verify voltage pvfy may be greater than the step voltage Δvstep. Since the step voltage Δvstep is less than the difference between the main verify voltage mvfy and the pre-verify voltage pvfy, the threshold voltage of the first memory cell M1 and the second memory cell M2 belonging to the Dpgm region in the second loop $2^{nd}$ loop may also belong to the Dpgm region in the third loop $3^{rd}$ loop.

Thereafter, in a fourth loop $4^{th}$ loop, the memory device 100 may apply the program control voltage Vctrl to the first bit line to which the first memory cell M1 is connected and the second bit line to which the second memory cell M2 is connected, and apply the program voltage to the word line connected to the first memory cell M1 and the second memory cell M2.

In the fourth loop $4^{th}$ loop, since the program voltage applied to the word line is greater than the program voltage applied to the word line in the third loop $3^{rd}$ loop by the step voltage Δvstep, a degree by which the threshold voltage of the first memory cell M1 and the second memory cell M2 increases may be greater than a degree by which the threshold voltage of the first memory cell and the second memory cell increases in the third loop $3^{rd}$ loop.

When the degree by which the threshold voltage of the first memory cell M1 and the second memory cell M2 increases in the fourth loop $4^{th}$ loop is great, a threshold voltage distribution of the target program state PVT may be formed wide. In order to improve formation of the wide threshold voltage distribution of the target program state PVT, the memory device 100 may determine a voltage to be applied to the bit line connected to the memory cell based on the number of times the pre-verify operation is passed as the program allowable voltage Vallow or the program control voltage Vctrl.

Figure 7:
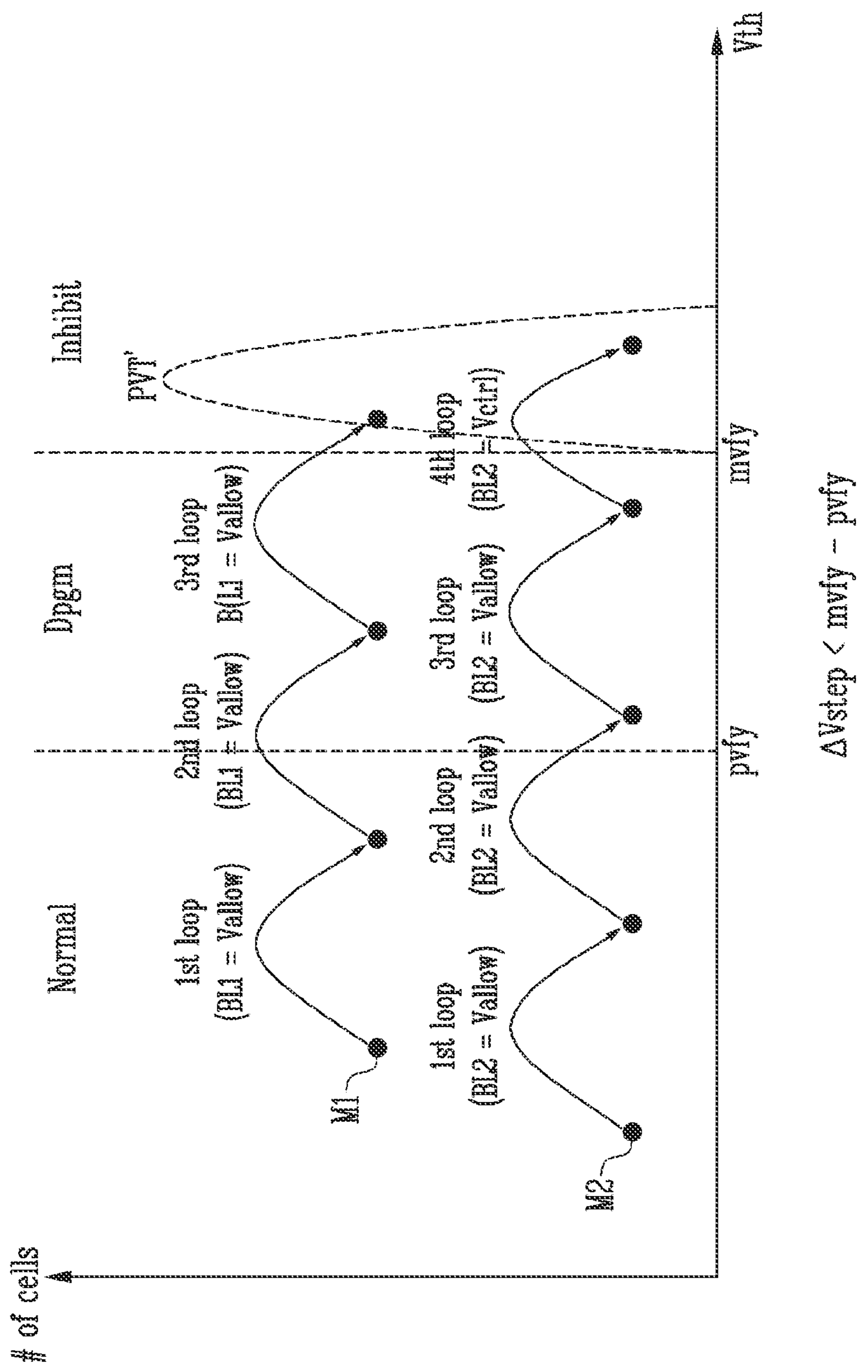
FIG. 7 is a diagram illustrating a threshold voltage of the memory cells changed according to a voltage applied to a bit line during the double verify program operation.

FIG. 7 is a diagram illustrating a threshold voltage of the memory cells changed according to the voltage applied to the bit line during the double verify program operation.

In FIG. 7, a content overlapping that of FIG. 6 is omitted. Referring to FIG. 7, in the first loop $1^{st}$ loop, the pre-verify operation and the main verify operation on each of the first memory cell M1 and the second memory cell M2 may be failed.

In the second loop $2^{nd}$ loop, the memory device 100 may apply the program allowable voltage Vallow to the first bit line connected to the first memory cell M1 and the second bit line connected to the second memory cell M2. In the second loop $2^{nd}$ loop, the pre-verify operation on the first memory cell M1 and the second memory cell M2 may be passed, and the main verify operation may be failed.

In an embodiment, in the second loop $2^{nd}$ loop, when the pre-verify operation on the first memory cell M1 and the second memory cell M2 is passed once, in the third loop $3^{rd}$ loop, the memory device may apply the program allowable voltage Vallow to the first bit line connected to the memory cell M1 and the second bit line connected to the second memory cell M2, and apply the word line connected to the first memory cell M1 and the second memory cell M2.

In an embodiment, when the pre-verify operation on the first memory cell M1 and the second memory cell M2 is failed in the first loop $1^{st}$ loop, and the pre-verify operation on the first memory cell M1 and the second memory cell M2 is passed in the second loop $2^{nd}$ loop, the memory device may apply the program allowable voltage Vallow to the first bit line connected to the first memory cell M1 and the second bit line connected to the second memory cell M2 in a third loop $3^{rd}$ loop.

In an embodiment, in the third loop $3^{rd}$ loop, the threshold voltage of the first memory cell M1 may be greater than the pre-verify voltage pvfy and the main verify voltage mvfy. That is, in the third loop $3^{rd}$ loop, the pre-verify operation and the main verify operation on the first memory cell M1 may be passed.

In the third loop $3^{rd}$ loop, the threshold voltage of the second memory cell M2 may be greater than the pre-verify voltage pvfy and less than the main verify voltage mvfy. In the third loop $3^{rd}$ loop, the pre-verify operation on the second memory cell M2 may be passed, and the main verify operation may be failed.

In an embodiment, when the pre-verify operation is passed twice, the memory device 100 may apply the program control voltage Vctrl or the program inhibit voltage based on whether the threshold voltage of the memory cell is greater than the main verify voltage mvfy.

In an embodiment, when the pre-verify operation on the first memory cell M1 and the second memory cell M2 is passed in the second loop $2^{nd}$ loop and the pre-verify operation on the first memory cell M1 and the second memory cell M2 is passed in the third loop $3^{rd}$ loop, the memory device 100 may apply the program control voltage Vctrl or the program inhibit voltage to the first bit line connected to the first memory cell M1 and the second bit line connected to the second memory cell M2 in the fourth loop $4^{th}$ loop.

Specifically, since the pre-verify operation and the main verify operation on the first memory cell M1 is passed in the third loop $3^{rd}$ loop, the memory device may apply the program inhibit voltage to the first bit line connected to the first memory cell M1 in the fourth loop $4^{th}$ loop.

Since the pre-verify operation on the second memory cell M2 is passed and the main verify operation is failed in the third loop $3^{rd}$ loop, the memory device 100 may apply the program control voltage Vctrl to the second bit line connected to the second memory cell M2 in the fourth loop $4^{th}$ loop.

In an embodiment, the memory device 100 may form a threshold voltage distribution of a target program state PVT narrow by applying the program allowable voltage Vallow or the program control voltage Vctrl to the bit line connected to the memory cell based on the number of times the pre-verify operation is passed without directly applying the program control voltage Vctrl to the bit line connected to the memory cell, even though the memory device 100 belongs to the Dpgm region where the threshold voltage is greater than the pre-verify voltage pvfy and less than the main verify voltage mvfy.

Figure 8:
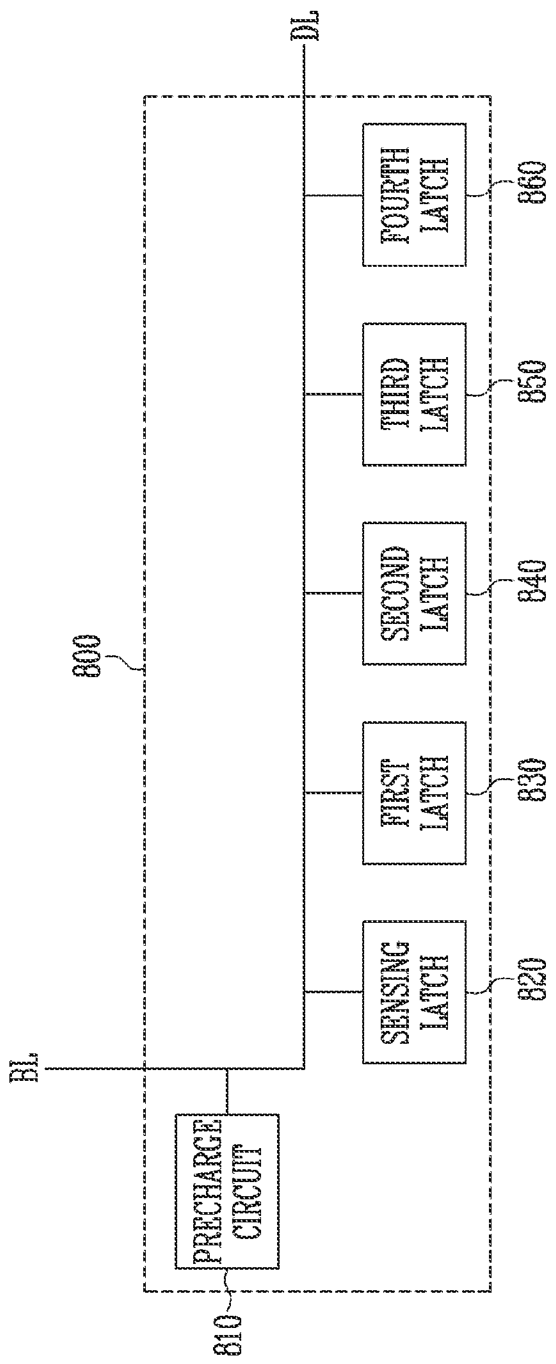
FIG. 8 is a diagram illustrating a page buffer storing pre-verify data and main verify data sensed by a pre-verify operation and a main verify operation.

FIG. 8 is a diagram illustrating a page buffer storing pre-verify data and main verify data sensed by the pre-verify operation and the main verify operation.

The page buffer 800 shown in FIG. 8 may be the page buffer 170 shown in FIG. 2.

Referring to FIG. 8, the page buffer 800 may include a precharge circuit 810, a sensing latch 820, a first latch 830, a second latch 840, a third latch 850, and a fourth latch 860.

The precharge circuit 810 may control the voltage to be applied to the bit line BL. The precharge circuit 810 may apply the program allowable voltage, the program control voltage, or the program inhibit voltage to the bit line BL under control of the bit line control circuit 182 shown in FIG. 2.

The sensing latch 820 may store data sensed from the memory cell connected to the bit line BL. The sensing latch 820 may store the pre-verify data sensed by the pre-verify operation using the pre-verify voltage or the main verify data sensed by the main verify operation using the main verify voltage.

The sensing latch 820 may provide the data sensed from the memory cell to the first latch 830, the second latch 840, the third latch 850, or the fourth latch 860, which are connected in parallel to the bit line BL. In an embodiment, the sensing latch 820 may provide the pre-verify data sensed by the pre-verify operation in any one loop to the first latch 830 or the third latch 850, and provide the main verify data sensed by the memory verify operation in any one loop to the second latch 840 or the fourth latch 860.

The first latch 830 may store pre-verify data sensed by a pre-verify operation in a previous loop of any one loop. The second latch 840 may store main verify data sensed by a main verify operation in the previous loop of any one loop. That is, the first latch 830 and the second latch 840 may store data sensed by the pre-verify operation and the main verify operation in the previous loop of the current loop.

The third latch 850 may store the pre-verify data sensed by the pre-verify operation in any one loop. The fourth latch 860 may store the main verify data sensed by the main verify operation in any one loop. That is, the third latch 850 and the fourth latch 860 may store data sensed by the pre-verify operation and the main verify operation in the current loop.

The first latch 830 and the third latch 850 may store the pass data indicating that the pre-verify operation is passed or the fail data indicating that the pre-verify operation is failed. In an embodiment, the first latch 830 and the third latch 850 may store the pass data indicating that the pre-verify operation is passed when the threshold voltage of the memory cell is greater than the pre-verify voltage. In an embodiment, the first latch 830 and the third latch 850 may store the fail data indicating that the pre-verify operation is failed when the threshold voltage of the memory cell is less than the pre-verify voltage.

The second latch 840 and the fourth latch 860 may store the pass data indicating that the main verify operation is passed or the fail data indicating that the main verify operation is failed. In an embodiment, the second latch 840 and the fourth latch 860 may store the pass data indicating that the main verify operation is passed when the threshold voltage of the memory cell is greater than the main verify voltage. In an embodiment, the second latch 840 and the fourth latch 860 may store the fail data indicating that the main verify operation is failed when the threshold voltage of the memory cell is less than the main verify voltage.

FIG. 9 is a chart illustrating an embodiment of data stored in a plurality of latches during the program operation.

In FIG. 9, the program operation on the first memory cell M1 shown in FIG. 7 is described as an example. Referring to FIG. 9, the memory device 100 may perform the first loop $1^{st}$ loop for the first memory cell M1. In the first loop $1^{st}$ loop, the memory device 100 may apply the program allowable voltage Vallow to a first bit line BL1 connected to the first memory cell M1, and apply the program voltage to the word connected to the first memory cell M1. In the first loop $1^{st}$ loop, the memory device 100 may perform the pre-verify operation and the main verify operation on the first memory cell M1. In the first loop $1^{st}$ loop, the threshold voltage of the first memory cell M1 may be less than the pre-verify voltage and the main verify voltage. In the first loop $1^{st}$ loop, the pre-verify operation and the main verify operation on the first memory cell M1 may be failed.

The third latch 850 may store fail data Fail indicating that the pre-verify operation on the first memory cell M1 is failed in the first loop $1^{st}$ loop. The fourth latch 860 may store fail data Fail indicating that the main verify operation on the first memory cell M1 is failed in the first loop $1^{st}$ loop. The fail data Fail stored in the third latch 850 and the fourth latch 860 may be provided to the first latch 730 and the second latch 740.

In the second loop $2^{nd}$ loop, the memory device 100 may apply the program allowable voltage Vallow to the first bit line BL1 connected to the first memory cell M1, apply the program voltage to the word connected to the first memory cell M1, and perform the pre-verify operation and the main verify operation on the first memory cell M1. In the second loop $2^{nd}$ loop, the threshold voltage of the first memory cell M1 may be greater than the pre-verify voltage and less than the main verify voltage. In the second loop $2^{nd}$ loop, the pre-verify operation on the first memory cell M1 may be passed, and the main verify operation may be failed.

The third latch 850 may store pass data Pass indicating that the pre-verify operation on the first memory cell M1 is passed in the second loop $2^{nd}$ loop. The fourth latch 860 may store the fail data Fail indicating that the main verify operation on the first memory cell M1 is failed in the second loop $2^{nd}$ loop.

The memory device 100 may determine a voltage to be applied to the first bit line BL1 connected to the first memory cell M1 in the third loop $3^{rd}$ loop, based on a result of comparing the data stored in the first latch 830 and the second latch 840 with the data stored in the third latch 850 and the fourth latch 860 in the second loop $2^{nd}$ loop.

In an embodiment, when the data stored in the first latch 830 and the data stored in the third latch 850 do not match as the data stored in the first latch 830 is the fail data Fail and the data stored in the third latch 850 is the pass data Pass in the second loop $2^{nd}$ loop, the memory device 100 may apply the program allowable voltage Vallow to the first bit line BL1 connected to the first memory cell M1 in the third loop $3^{rd}$ loop.

The data stored in the first latch 830 and the second latch 840 may be data indicating a result of the pre-verify operation and the main verify operation on the first memory cell M1 in the first loop $1^{st}$ loop. The data stored in the third latch 850 and the fourth latch 860 may be data indicating a result of the pre-verify operation and the main verify operation on the first memory cell M1 in the second loop $2^{nd}$ loop.

When the pre-verify operation on the first memory cell M1 is failed in the first loop $1^{st}$ loop and the pre-verify operation on the first memory cell M1 is passed in the second loop $2^{nd}$ loop, the memory device 100 may apply the program allowable voltage Vallow to the first bit line BL1 connected to the first memory cell M1 in the third loop $3^{rd}$ loop.

In the third loop $3^{rd}$ loop, the memory device 100 may apply the program voltage to the word line connected to the first memory cell M1, and perform the pre-verify operation and the main verify operation on the first memory cell M1.

In the third loop $3^{rd}$ loop, the threshold voltage of the first memory cell M1 may be greater than the pre-verify voltage and the main verify voltage. In the third loop $3^{rd}$ loop, the pre-verify operation and the main verify operation on the first memory cell M1 may be passed.

The third latch 850 may store the pass data Pass indicating that the pre-verify operation on the first memory cell M1 is passed in the third loop $3^{rd}$ loop. The fourth latch 860 may store the pass data Pass indicating that the main verify operation on the first memory cell M1 is passed in the third loop $3^{rd}$ loop. The first latch 830 may store the pass data Pass indicating that the pre-verify operation on the first memory cell M1 is passed in the second loop $2^{nd}$ loop. The second latch 840 may store the fail data Fail indicating that the pre-verify operation on the first memory cell M1 is failed in the second loop $2^{nd}$ loop.

The memory device 100 may determine the voltage to be applied to the first bit line BL1 connected to the first memory cell M1 in the fourth loop $4^{th}$ loop based on a result of comparing the data stored in the second latch 840 with the data stored in the fourth latch 860 in the third loop $3^{rd}$ loop. In an embodiment, when the data stored in the second latch 840 and the data stored in the fourth latch 860 do not match as the data stored in the second latch 840 is the fail data Fail and the data stored in the fourth latch 860 is the pass data Pass in the third loop $3^{rd}$ loop, the memory device 100 may apply the program inhibit voltage Vinh to the first bit line BL1 connected to the first memory cell M1 in the fourth loop $4^{th}$ loop.

FIG. 10 is a chart illustrating another embodiment of the data stored in the plurality of latches during the program operation.

In FIG. 10, the program operation on the second memory cell M2 shown in FIG. 7 is described as an example. Referring to FIG. 10, the memory device 100 may perform the first loop $1^{st}$ loop for the second memory cell M2. In the first loop $1^{st}$ loop, the memory device 100 may apply the program allowable voltage Vallow to a second bit line BL2 connected to the second memory cell M2, apply the program voltage to the word connected to the second memory cell M2, and perform the pre-verify operation and the main verify operation on the second memory cell M2. In the first loop $1^{st}$ loop, the threshold voltage of the second memory cell M2 may be less than the pre-verify voltage and the main verify voltage. In the first loop $1^{st}$ loop, the pre-verify operation and the main verify operation on the second memory cell M2 may be failed.

The third latch 850 may store fail data Fail indicating that the pre-verify operation on the second memory cell M2 is failed in the first loop $1^{st}$ loop. The fourth latch 860 may store fail data Fail indicating that the main verify operation on the second memory cell M2 is failed in the first loop $1^{st}$ loop.

In the second loop $2^{nd}$ loop, the memory device 100 may apply the program allowable voltage Vallow to the second bit line BL2 connected to the second memory cell M2, apply the program voltage to the word connected to the second memory cell M2, and perform the pre-verify operation and the main verify operation on the second memory cell M2. In the second loop $2^{nd}$ loop, the threshold voltage of the second memory cell M2 may be greater than the pre-verify voltage and less than the main verify voltage. In the second loop $2^{nd}$ loop, the pre-verify operation on the second memory cell M2 may be passed, and the main verify operation may be failed.

The third latch 850 may store pass data Pass indicating that the pre-verify operation on the second memory cell M2 is passed in the second loop $2^{nd}$ loop. The fourth latch 860 may store the fail data Fail indicating that the main verify operation on the second memory cell M2 is failed in the second loop $2^{nd}$ loop. The first latch 830 and the second latch 840 may store the fail data indicating that the pre-verify operation and the main verify operation on the second memory cell M2 are failed in the first loop $1^{st}$ loop.

The memory device 100 may apply the program allowable voltage Vallow to the second bit line BL2 connected to the second memory cell M2 in the third loop $3^{rd}$ loop, based on a result of comparing the data stored in the first latch 830 and the second latch 840 with the data stored in the third latch 850 and the fourth latch 860 in the second loop $2^{nd}$ loop. In an embodiment, when the data stored in the first latch 830 and the data stored in the third latch 850 do not match as the data stored in the first latch 830 is the fail data Fail and the data stored in the third latch 850 is the pass data Pass in the second loop $2^{nd}$ loop, the memory device 100 may apply the program allowable voltage Vallow to the second bit line BL2 connected to the second memory cell M2 in the third loop $3^{rd}$ loop.

When the pre-verify operation on the second memory cell M2 is failed in the first loop $1^{st}$ loop and the pre-verify operation on the second memory cell M2 is passed in the second loop $2^{nd}$ loop, the memory device 100 may apply the program allowable voltage Vallow to the second bit line BL2 connected to the second memory cell M2 in the third loop $3^{rd}$ loop.

In the third loop $3^{rd}$ loop, the memory device 100 may apply the program voltage to the word line connected to the second memory cell M2, and perform the pre-verify operation and the main verify operation on the second memory cell M2.

In the third loop $3^{rd}$ loop, the threshold voltage of the second memory cell M2 may be greater than the pre-verify voltage and less than the main verify voltage. In the third loop $3^{rd}$ loop, the pre-verify operation on the second memory cell M2 may be passed and the main verify operation on the second memory cell M2 may be failed.

The third latch 850 may store the pass data Pass indicating that the pre-verify operation on the second memory cell M2 is passed in the third loop $3^{rd}$ loop. The fourth latch 860 may store the fail data Fail indicating that the main verify operation on the second memory cell M2 is failed in the third loop $3^{rd}$ loop. The first latch 830 may store the pass data Pass indicating that the pre-verify operation on the second memory cell M2 is passed in the second loop $2^{nd}$ loop. The second latch 840 may store the fail data Fail indicating that the pre-verify operation on the second memory cell M2 is failed in the second loop $2^{nd}$ loop.

The memory device 100 may determine a voltage to be applied to the second bit line BL2 connected to the second memory cell M2 in the fourth loop $4^{th}$ loop based on a result of comparing the data stored in the first latch 830 and the second latch 840 with the data stored in the third latch 850 and the fourth latch 860 in the third loop $3^{rd}$ loop.

When the data stored in the first latch 830 and the third latch 850 match as the pass data Pass in the third loop $3^{rd}$ loop, and the data stored in the second latch 840 and the fourth latch 860 match as the fail data Fail, the memory device 100 may apply the program control voltage Vctrl to the second bit line BL2 connected to the second memory cell M2 in the fourth loop $4^{th}$ loop. In the fourth loop $4^{th}$ loop, the memory device 100 may apply the program voltage to the word line connected to the second memory cell M2, and perform the pre-verify operation and the main verify operation on the second memory cell M2.

In the fourth loop $4^{th}$ loop, the threshold voltage of the second memory cell M2 may be greater than the pre-verify voltage and the main verify voltage. In the $4^{th}$ loop $4^{th}$ loop, the pre-verify operation and the main verify operation on the second memory cell M2 may be passed.

The third latch 850 may store the pass data Pass indicating that the pre-verify operation on the second memory cell M2 is passed in the fourth loop $4^{th}$ loop. The fourth latch 860 may store the pass data Pass indicating that the main verify operation on the second memory cell M2 is passed in the fourth loop $4^{th}$ loop.

When the pass data Pass is stored in the third latch 850 and the fourth latch 860 in the fourth loop $4^{th}$ loop, the memory device 100 may apply the program inhibit voltage Vinh to the second bit line BL2 connected to the second memory cell M2 in a fifth loop $5^{th}$ loop.

Figure 11:
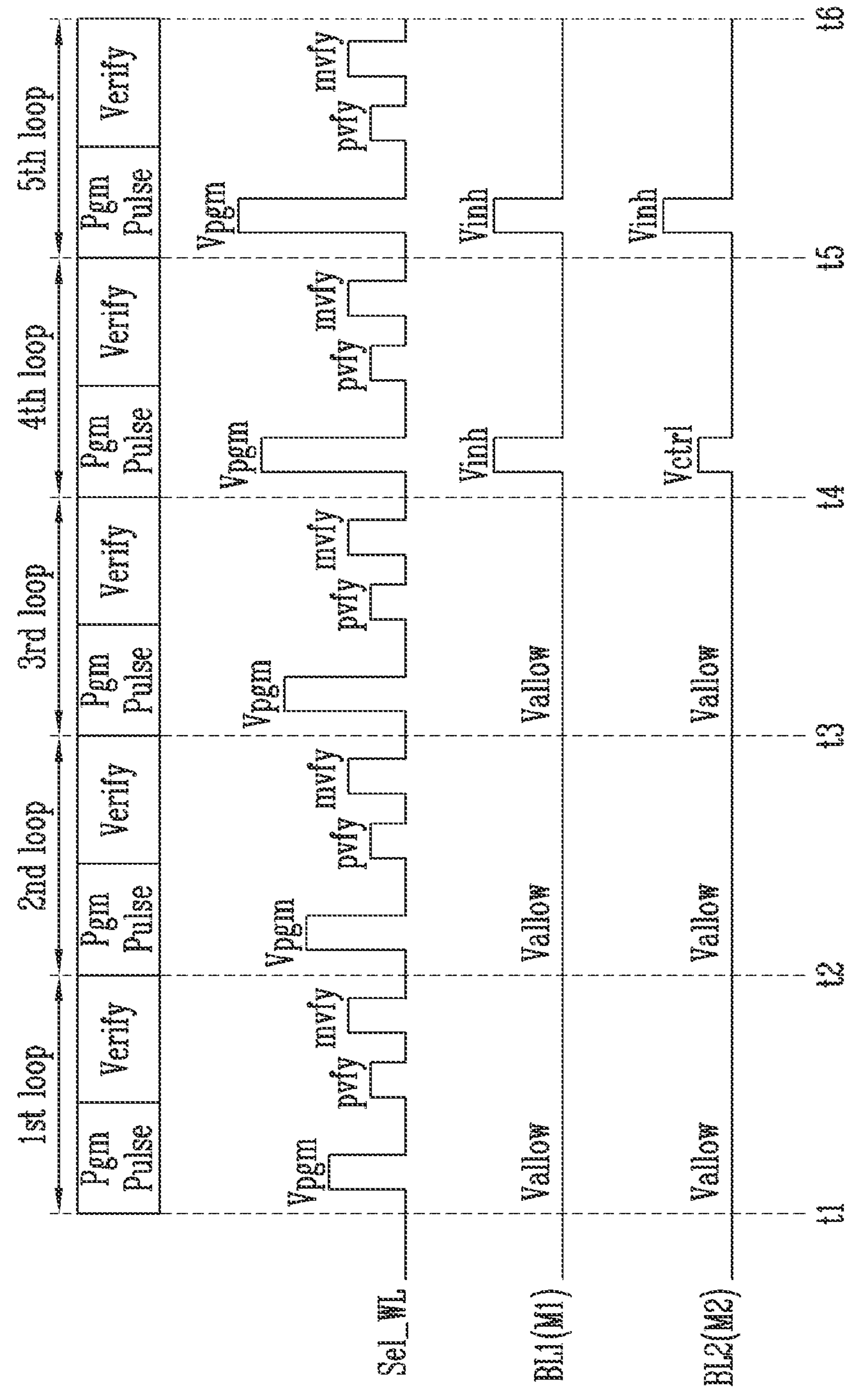
FIG. 11 is a timing diagram illustrating a voltage applied to a bit line during a program operation according to an embodiment of the present disclosure.

FIG. 11 is a timing diagram illustrating a voltage applied to a bit line during a program operation according to an embodiment of the present disclosure.

In FIG. 11, a case where the program operation on the first memory cell M1 and the second memory cell M2 shown in FIG. 7 is performed is described as an example.

Referring to FIG. 11, the memory device 100 may perform the first to fifth loops $1^{st}$ loop to $5^{th}$ loop for the first memory cell M1 and the second memory cell M2. Each of the first to fifth loops $1^{st}$ loop to $5^{th}$ loop may include the program voltage apply operation Pgm Pulse and the verify operation Verify. The first memory cell M1 and the second memory cell M2 may be commonly connected to the word line.

In the first loop $1^{st}$ loop, the memory device 100 may apply the program allowable voltage Vallow to first bit line BL1 connected to the first memory cell M1 and the second bit line BL2 connected to the second memory cell M2, and apply the program voltage Vpgm to the word line connected to the first memory cell M1 and the second memory cell M2. In the first loop $1^{st}$ loop, the memory device 100 may identify the threshold voltage of the first memory cell M1 and the second memory cell M2 by applying the pre-verify voltage pvfy and the main verify voltage mvfy to the word line connected to the first memory cell M1 and the second memory cell M2.

When the threshold voltage of the first memory cell M1 and the second memory cell M2 identified in the first loop $1^{st}$ loop is less than the pre-verify voltage pvfy, the memory device 100 may apply the program allowable voltage Vallow to the first bit line BL1 connected to the first memory cell M1 and the second bit line BL2 connected to the second memory cell M2 in the second loop $2^{nd}$ loop. In the second loop $2^{nd}$ loop, the memory device 100 may apply the program voltage Vpgm to the word line connected to the first memory cell M1 and the second memory cell M2, and apply the pre-verify voltage pvfy and the main verify voltage mvfy.

When the threshold voltage of the first memory cell M1 and the second memory cell M2 identified in the second loop $2^{nd}$ loop is greater than the pre-verify voltage pvfy and less than the main verify voltage mvfy, the memory device 100 may apply the program allowable voltage Vallow to the first bit line BL1 connected to the first memory cell M1 and the second bit line BL2 connected to the second memory cell M2 in the third loop $3^{rd}$ loop. In the third loop $3^{rd}$ loop, the memory device 100 may apply the program voltage Vpgm to the word line connected to the first memory cell M1 and the second memory cell M2, and apply the pre-verify voltage pvfy and the main verify voltage mvfy.

When the threshold voltage of the first memory cell M1 identified in the third loop $3^{rd}$ loop is greater than the main verify voltage mvfy, the memory device 100 may apply the program inhibit voltage Vinh to the first bit line BL1 connected to the first memory cell M1 in the fourth loop $4^{th}$ loop. When the threshold voltage of the second memory cell M2 identified in the third loop $3^{rd}$ loop is less than the main verify voltage mvfy, the memory device 100 may apply the program control voltage Vctrl to the second bit line BL2 connected to the second memory cell M2 in the fourth loop $4^{th}$ loop. In the fourth loop $4^{th}$ loop, the memory device 100 may apply the program voltage Vpgm to the word line connected to the first memory cell M1 and the second memory cell M2, and apply the pre-verify voltage pvfy and the main verify voltage mvfy.

When the threshold voltage of the first memory cell M1 and the second memory cell M2 identified in the fourth loop $4^{th}$ loop is greater than the main verify voltage mvfy, the memory device 100 may apply the program inhibit voltage Vinh to the first bit line BL1 connected to the first memory cell M1 and the second bit line BL2 connected to the second memory cell M2 in the fifth loop $5^{th}$ loop.

Figure 12:
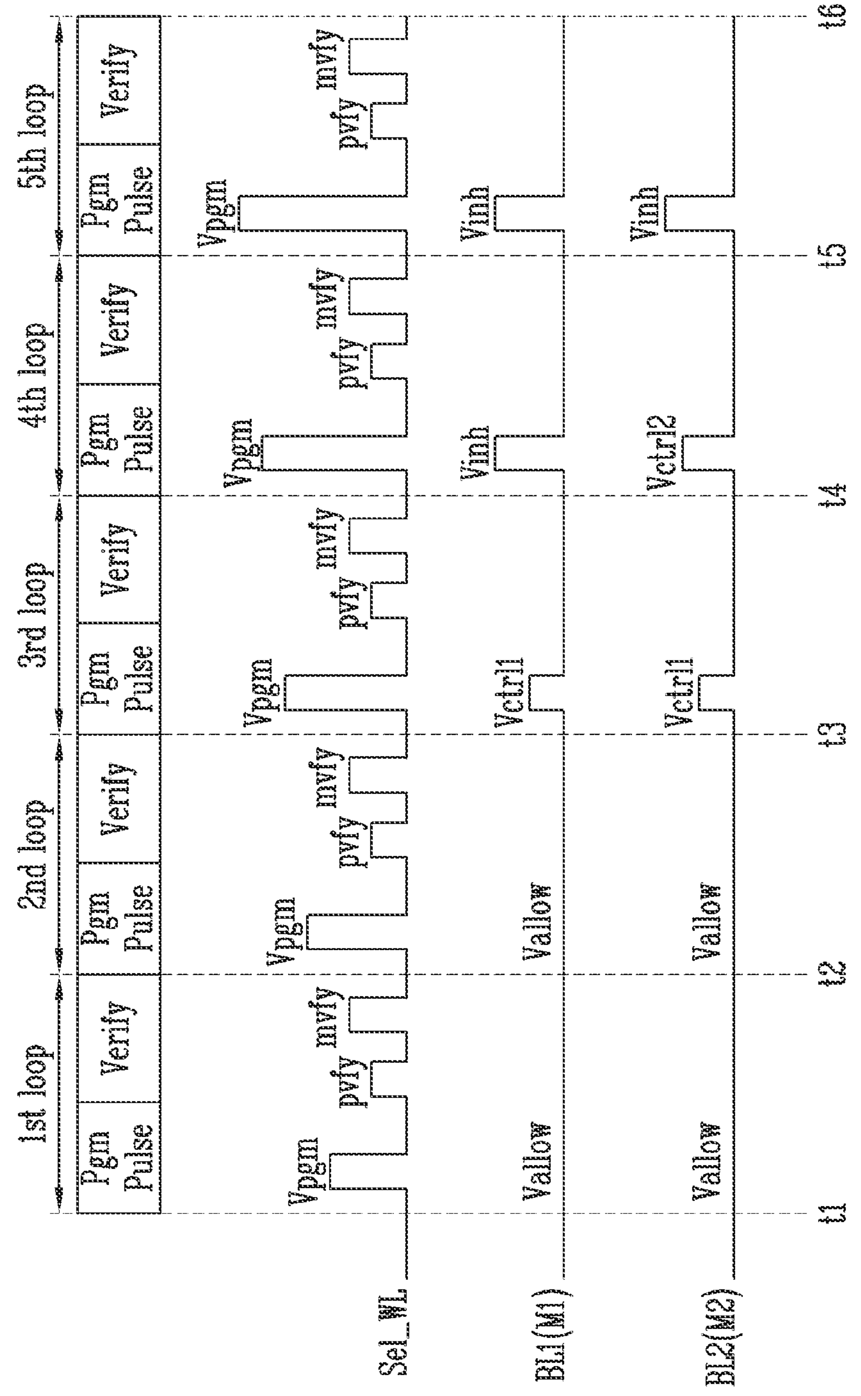
FIG. 12 is a timing diagram illustrating a voltage applied to a bit line during a program operation according to another embodiment of the present disclosure.

FIG. 12 is a timing diagram illustrating a voltage applied to a bit line during a program operation according to another embodiment of the present disclosure.

In FIG. 12, a case where the program operation on the first memory cell M1 and the second memory cell M2 shown in FIG. 7 is performed is described as an example.

Referring to FIG. 12, the memory device 100 may perform the first loop $1^{st}$ loop and the second loop $2^{nd}$ loop for the first memory cell M1 and the second memory cell M2. When the threshold voltage of the first memory cell M1 and the second memory cell identified in the second loop $2^{nd}$ loop is greater than the pre-verify voltage pvfy and less than the main verify voltage mvfy, the memory device 100 may apply a first program control voltage Vctrl1 to the first bit line BL1 connected to the first memory cell M1 and the second bit line BL2 connected to the second memory cell M2 in the third loop $3^{rd}$ loop. In the third loop $3^{rd}$ loop, the memory device 100 may apply the program voltage Vpgm to the word line connected to the first memory cell M1 and the second memory cell M2, and apply the pre-verify voltage pvfy and the main verify voltage mvfy.

When the threshold voltage of the first memory cell M1 identified in the third loop $3^{rd}$ loop is greater than the main verify voltage mvfy, the memory device 100 may apply the program inhibit voltage Vinh to the first bit line BL1 connected to the first memory cell M1 in the fourth loop $4^{th}$ loop. When the threshold voltage of the second memory cell M2 identified in the third loop $3^{rd}$ loop is less than the main verify voltage mvfy, the memory device 100 may apply a second program control voltage Vctrl2 greater than the first program control voltage Vctrl1 to the second bit line BL2 connected to the second memory cell M2 in the fourth loop $4^{th}$ loop. The second program control voltage Vctrl2 may be less than the program inhibit voltage Vinh.

When the threshold voltage of the first memory cell M1 and the second memory cell M2 identified in the fourth $4^{th}$ loop is greater than the main verify voltage mvfy, the memory device 100 may apply the program inhibit voltage Vinh to the first bit line BL1 connected to the first memory cell M1 and the second bit line BL2 connected to the second memory cell M2 in the fifth $5^{th}$ loop.

Figure 13:
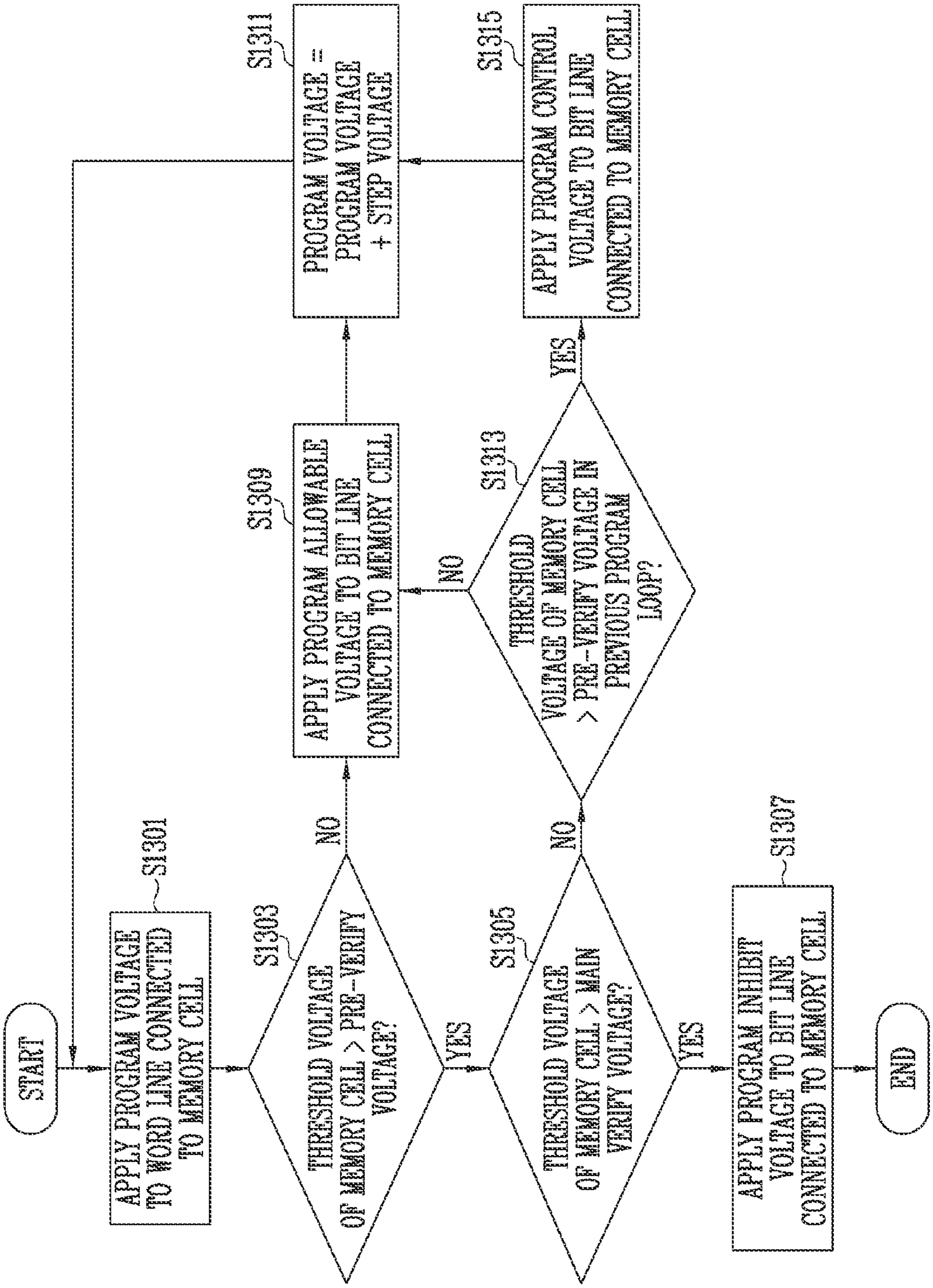
FIG. 13 is a flowchart illustrating the program operation of the memory device.

FIG. 13 is a flowchart illustrating the program operation of the memory device.

Referring to FIG. 13, in step S1301, the memory device 100 may apply the program voltage to the word line connected to the memory cell. The threshold voltage of the memory cell may increase by the program voltage.

In step S1303, the memory device 100 may identify whether the threshold voltage of the memory cell is greater than the pre-verify voltage. When the threshold voltage of the memory cell is greater than the pre-verify voltage, step S1305 may be performed. When the threshold voltage of the memory cell is equal to or less than the pre-verify voltage, step S1309 may be performed.

In step S1305, the memory device 100 may identify whether the threshold voltage of the memory cell is greater than the main verify voltage. When the threshold voltage of the memory cell is greater than the main verify voltage, step S1307 may be performed. When the threshold voltage of the memory cell is less than or equal to the main verify voltage, step S1313 may be performed.

In step S1307, when the threshold voltage of the memory cell is greater than the main verify voltage, the memory device 100 may apply the program inhibit voltage to the bit line connected to the memory cell. When the program inhibit voltage is applied to the bit line connected to the memory cell, the threshold voltage of the memory cell may not increase.

In step S1309, when the threshold voltage of the memory cell is less than or equal to the pre-verify voltage, the memory device 100 may apply the program allowable voltage to the bit line connected to the memory cell.

In step S1311, the memory device 100 may increase the program voltage by the step voltage. The memory device 100 may determine a sum of the step voltage and the program voltage applied to the word line in any one program loop as the program voltage to be applied to the word line in a next program loop of any one program loop.

In step S1313, the memory device 100 may identify whether the threshold voltage of the memory cell is greater than the pre-verify voltage in a previous program loop of any one program loop. In an embodiment, data indicating whether the threshold voltage of the memory cell is greater than the pre-verify voltage in the previous program loop of any one program loop may be stored in the first latch 830 shown in FIG. 8.

When the threshold voltage of the memory cell is equal to or less than the pre-verify voltage in the previous program loop, the memory device 100 may apply the program allowable voltage to the bit line connected to the memory cell. When the threshold voltage of the memory cell is greater than the pre-verify voltage in the previous program loop, step S1315 may be performed.

In step S1315, when the threshold voltage of the memory cell is greater than the pre-verify voltage in the previous program loop, the memory device 100 may apply the program control voltage to the bit line connected to the memory cell. The program control voltage may be greater than the program allowable voltage and less than the program inhibit voltage.

Figure 14:
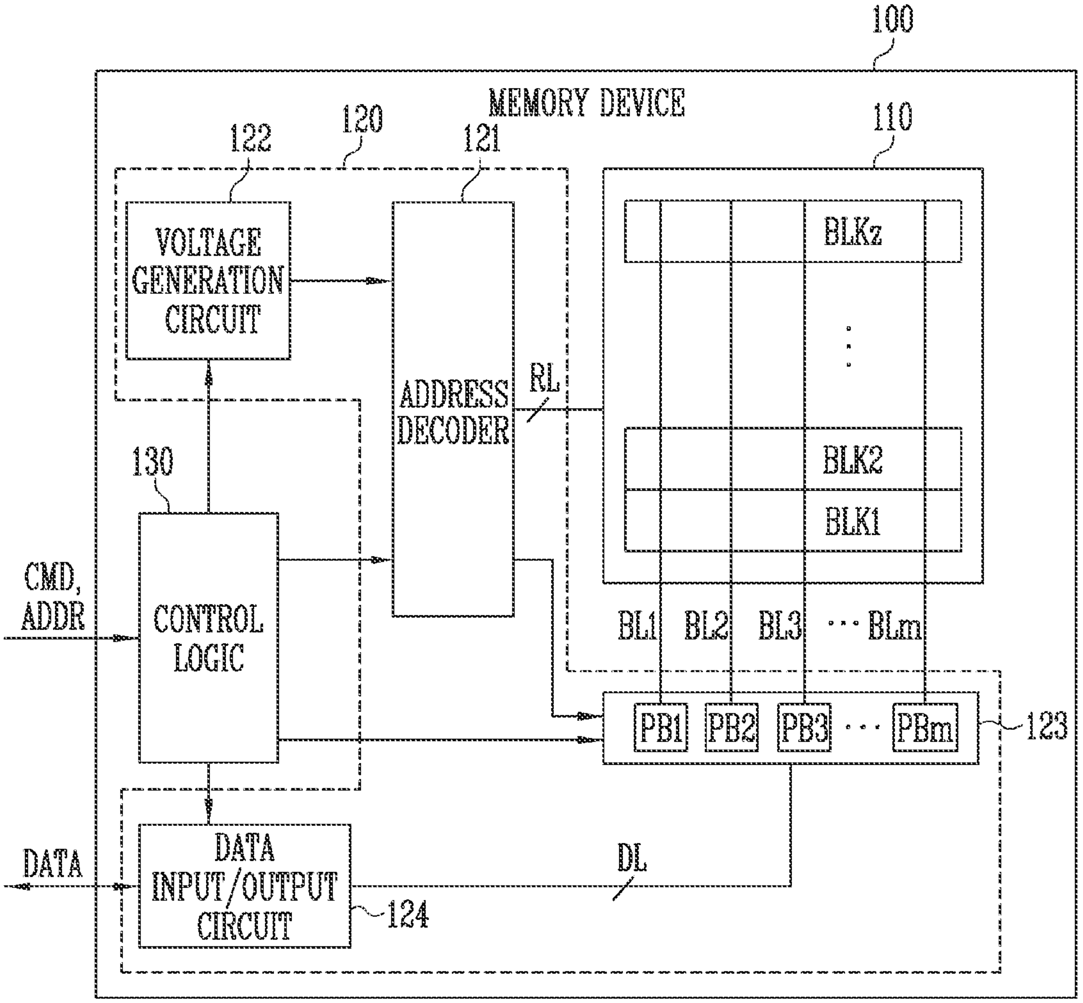
FIG. 14 is a diagram illustrating a structure of the memory device.

FIG. 14 is a diagram illustrating a structure of the memory device.

Referring to FIG. 14, the memory device 100 may include a memory cell array 110, a peripheral circuit 120, and a control logic 130.

The memory cell array 110 may include a plurality of memory blocks BLK1 to BLKz. The plurality of memory blocks BLK1 to BLKz may be connected to an address decoder 121 through row lines RL. The plurality of memory blocks BLK1 to BLKz may be connected to a page buffer group 123 through bit lines BL1 to BLm. Each of the plurality of memory blocks BLK1 to BLKz may include a plurality of memory cells. In an embodiment, the plurality of memory cells may be nonvolatile memory cells.

The peripheral circuit 120 may drive the memory cell array 110. For example, the peripheral circuit 120 may drive the memory cell array 110 to perform the program operation, the read operation, and the erase operation under control of the control logic 130. As another example, the peripheral circuit 120 may apply various operation voltages to the row lines RL and the bit lines BL1 to BLm or discharge the applied voltages according to the control of the control logic 130.

The peripheral circuit 120 may include the address decoder 121, a voltage generation circuit 122, the page buffer group 123, and a data input/output circuit 124.

The address decoder 121 may be connected to the memory cell array 110 through row lines RL. The row lines RL may include drain select lines, dummy word lines, a plurality of word lines, and source select lines.

The address decoder 121 may be configured to operate in response to the control of the control logic 130. The address decoder 121 may receive an address from the control logic 130.

The address decoder 121 may be configured to decode a row address of the received address. The address decoder 121 may select at least one word line of a selected memory block by applying voltages provided from the voltage generation circuit 122 to at least one word line according to the row address.

The address decoder 121 may be configured to decode a column address of the address. The column address may be transferred to the page buffer group 123. In an embodiment, the address decoder 121 may include the address decoder 160 of FIG. 2.

During the program operation, the address decoder 121 may apply the program voltage to a selected word line and apply a pass voltage having a level less than that of the program voltage to unselected word lines. During a program verify operation, the address decoder 121 may apply a verify voltage to the selected word line and apply a verify pass voltage having a level greater than that of the verify voltage to the unselected word lines.

During the read operation, the address decoder 121 may apply a read voltage to the selected word line and apply a read pass voltage having a level greater than that of the read voltage to the unselected word lines.

The voltage generation circuit 122 may generate a plurality of operation voltages using an external power voltage supplied to the memory device 100. The voltage generation circuit 122 may operate in response to control of the control logic 130. In an embodiment, the voltage generation circuit 122 may include the voltage generation circuit 150 of FIG. 2.

In an embodiment, the voltage generation circuit 122 may generate various operation voltages used for the program, read, and erase operations. For example, the voltage generation circuit 122 may generate a plurality of erase voltages, a plurality of program voltages, a plurality of pass voltages, a plurality of select read voltages, and a plurality of unselect read voltages. The operation voltages may be supplied to the memory cell array 110 by the address decoder 121.

The page buffer group 123 may include first to m-th page buffers PB1 to PBm. The first to m-th page buffers PB1 to PBm may be connected to the memory cell array 110 through first to m-th bit lines BL1 to BLm, respectively. The first to m-th page buffers PB1 to PBm may operate in response to the control of the control logic 130.

The first to m-th page buffers PB1 to PBm may communicate data with the data input/output circuit 124. At a time of program, the first to m-th page buffers PB1 to PBm may receive the data through the data input/output circuit 124 and data lines DL.

During the program operation, the first to m-th page buffers PB1 to PBm may transmit the data received through the data input/output circuit 124 to the selected memory cells through the bit lines BL1 to BLm. The memory cells of the selected page may be programmed according to the transmitted data. A memory cell connected to a bit line to which a program allowable voltage (for example, a ground voltage) is applied may have an increased threshold voltage. A threshold voltage of a memory cell connected to a bit line to which a program inhibit voltage (for example, a power voltage) is applied may be maintained. During the program verify operation, the first to m-th page buffers PB1 to PBm may read the data stored in the memory cells from the selected memory cells through the bit lines BL1 to BLm.

During the read operation, the page buffer group 123 may sense the data from the memory cells of the selected word line through the bit lines BL1 to BLm, and store the sensed data to the first to m-th page buffers PB1 to PBm.

The data input/output circuit 124 may be connected to the first to m-th page buffers PB1 to PBm through the data lines DL. The data input/output circuit 124 may operate in response to the control of the control logic 130. During the program operation, the data input/output circuit 124 may receive data to be stored from the memory controller 200. During the read operation, the data input/output circuit 124 may output the data sensed in the first to m-th page buffers PB1 to PBm to the memory controller 200.

The control logic 130 may be connected to the address decoder 121, the voltage generation circuit 122, the page buffer group 123, and the data input/output circuit 124. The control logic 130 may be configured to control all operations of the memory device 100. The control logic 130 may operate in response to a command CMD transferred from the memory controller 200.

The control logic 130 may generate various signals in response to the command CMD and the address ADDR to control the peripheral circuit 120. In an embodiment, the control logic 130 may include the program operation control circuit 180 shown in FIG. 2. In an embodiment, the control logic 130 may control the peripheral circuit 120 to perform the program operation including the plurality of program loops. In the first program loop among the plurality of included program loops, the control logic 130 may control the peripheral circuit 120 to apply the program allowable voltage to the bit line connected to the first memory cell having the threshold voltage greater than the pre-verify voltage and less than the main verify voltage among the plurality of memory cells. When it is identified that the threshold voltage of the first memory cell is less than the main verify voltage in the first program loop, the control logic 130 may control the peripheral circuit 120 to apply the program control voltage to the bit line connected to the first memory cell in the second program loop. When it is identified that the threshold voltage of the first memory cell is greater than the main verify voltage in the first program loop, the control logic 130 may control the peripheral circuit 120 to apply the program inhibit voltage to the bit line connected to the first memory cell in the second program loop.

Figure 15:
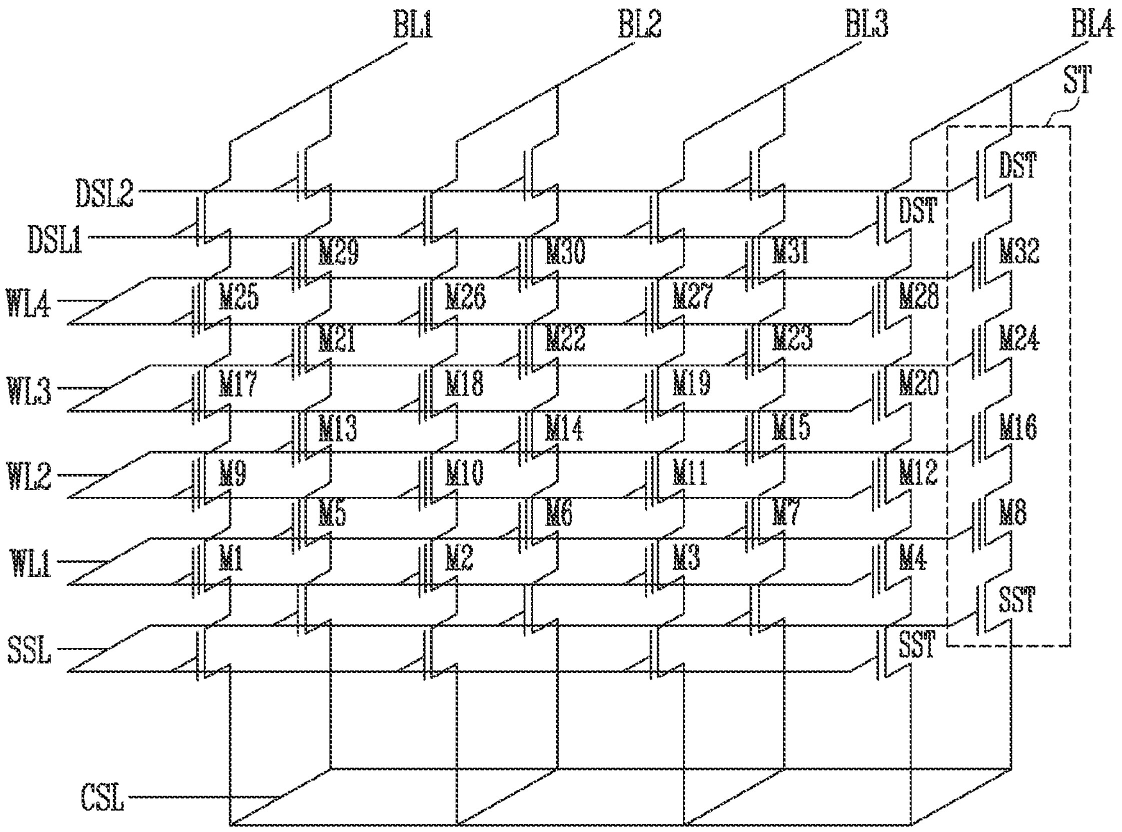
FIG. 15 is a diagram illustrating any one memory block among a plurality of memory blocks.

FIG. 15 is a diagram illustrating any one memory block among the plurality of memory blocks.

Referring to FIG. 15, a memory block may include a plurality of memory cell strings. Each memory cell string ST may include at least one drain select transistor DST, a plurality of memory cells, and at least one source select transistor SST. The plurality of memory cells may be connected in series between the drain select transistor DST and the source select transistor SST. Each memory cell included in one memory cell string ST may be connected to different word lines. For example, an eighth memory cell M8 included in one memory cell string ST may be connected to a first word line WL1, a sixteenth memory cell M16 may be connected to a second word line WL2, a twenty-fourth memory cell M24 may be connected to a third word line WL3, and a thirty-second memory cell M32 may be connected to a fourth word line WL4.

Each memory cell string ST may be connected to a common source line CSL. Each memory cell string ST may be connected to any one bit line among a plurality of bit lines BL1 to BL4. Each memory cell string ST may be connected to a drain select line DSL1 or DSL2, a plurality of word lines WL1 to WL4, and a source select line SSL. The drain select line DSL1 or DSL2 may be used as a gate electrode of the drain select transistor DST. The plurality of word lines WL1 to WL4 may be used as a gate electrode of the plurality of memory cells.

The plurality of memory cell strings may be connected to each of the plurality of bit lines BL1 to BL4. Each of the plurality of memory cell strings connected to one bit line may be connected to a first drain select line DSL1 or a second drain select line DSL2. In an embodiment, two memory cell strings may be connected to one bit line.

Memory cells connected to one word line may configure a plurality of physical pages. The number of physical pages included in one word line may be determined according to the number of memory cell strings commonly connected to one bit line. For example, when two memory cell strings are commonly connected to one bit line, one word line may include two physical pages. Specifically, first to fourth memory cells M1 to M4 may configure one physical page, and fifth to eighth memory cells M5 to M8 may configure one physical page.

One physical page may include a plurality of logical pages. The number of logical pages included in one physical page may be determined according to the number of bits to be stored in the memory cell. For example, when the memory cell is programmed with a TLC, one physical page may include three logical pages. The three logical pages may include a least significant bit (LSB) page, a central significant bit (CSB) page, and a most significant bit (MSB) page.

The number of each of the word lines, the memory cell strings, the bit lines, and the memory cells shown in FIG. 15 is for convenience of description, and may be less or greater than the number shown in FIG. 15.

Figure 16:
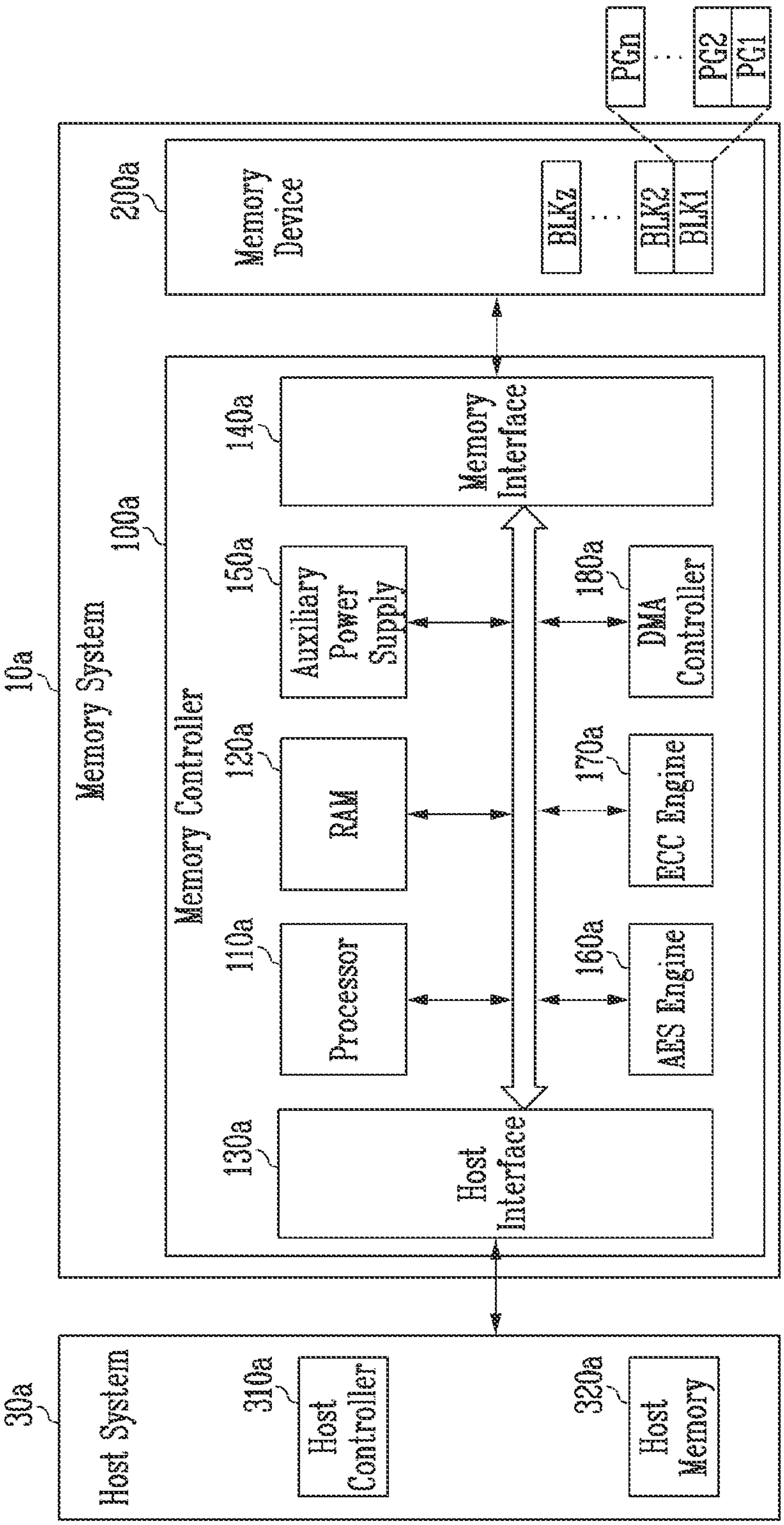
FIG. 16 is a block diagram illustrating an electronic system including a memory system.

FIG. 16 is a block diagram illustrating an electronic system including a memory system.

Referring to FIG. 16, the electronic system may include the memory system 10*a* and a host system 30*a*. In an embodiment, the memory system 10*a* may be an internal memory embedded in the electronic system. In another embodiment, the memory system 10*a* may be an external memory attached to or detachable from the host system 30*a*. In an embodiment, the memory system 50 shown in FIG. 1 may be implemented identically to the memory system 10*a* shown in FIG. 16.

The electronic system of the present disclosure may be implemented in various types of electronic devices. For example, the electronic system may be implemented in a mobile phone, a personal computer (PC), a tablet PC, a wearable device, a healthcare device, internet of things (IoT) device, a server device, a data center, an autopilot, a battery management system (BMS), an e-book, a game console device, a smart television, a digital camera, an artificial intelligence learning device, or the like.

The host system 30*a* may include a host controller 310*a* and a host memory 320*a*. In an embodiment, the host controller 310*a* and the host memory 320*a* may be implemented as separate semiconductor package chips. In another embodiment, the host controller 310*a* and the host memory 320*a* may be implemented as a single integrated semiconductor package chip.

The host controller 310*a* may provide a request related to data to the memory controller 100*a*. For example, the host controller 310*a* may provide a write request, data, and an address to the memory controller 100*a* to store data. The host controller 310*a* may provide a read request and an address to the memory controller 100*a* in order to read data. The host controller 310*a* may provide an erase request and an address to the memory controller 100*a* to erase data.

The host memory 320*a* may temporarily store data to be transmitted to the memory controller 100*a* or data received from the memory controller 100*a*. The host memory 320*a* may be implemented in a static random access memory (SRAM) or a dynamic RAM (DRAM).

The memory system 10*a* may include a memory controller 100*a* and at least one memory device 200*a*. The memory controller 100*a* may control the memory device 200*a*.

The memory controller 100*a* may include a processor 110*a*, a RAM 120*a*, a host interface 130*a*, a memory interface 140*a*, an auxiliary power supply 150*a*, an advanced encryption standard (AES) engine 160*a*, an error correction code (ECC) engine 170*a*, and a direct memory access (DMA) controller 180*a*, and these may communicate via a bus.

The processor 110*a* may operate as a central processing unit. The processor 110*a* may control overall operations of the memory controller 100*a*.

The processor 110*a* may generate a command to control an operation of the memory device 200*a* and provide the command to the memory device 200*a* through the memory interface 140*a*. Specifically, the processor 110*a* may generate a read command when the read request is received from the host system 30*a*, generate a program command when the write request is received from the host system 30*a*, and generate an erase command when the erase request is received from the host system 30*a*.

The processor 110*a* may perform a function of a flash translation layer (FTL). Specifically, the processor 110*a* may convert a logical address received from the host system 30*a* into a physical address. The physical address may be an address indicating a position of a storage region of the memory device 200*a*.

The RAM 120*a* may operate as a buffer memory. For example, the RAM 120*a* may temporarily store data received from the host system 30*a* or data received from the memory device 200*a*. In an embodiment, the RAM 120*a* may store mapping information of the logical address and the physical address. The processor 110*a* may provide data to be stored in the memory device 200*a* to the memory device 200*a* together with the program command. In an embodiment, an SRAM, a DRAM, a magnetic RAM (MRAM), a ferroelectric RAM (FeRAM), a phase-change RAM (PRAM), a resistive RAM (RRAM), or other various types of memory may be applied to the RAM 120*a*. In an embodiment, the RAM 120*a* may be positioned inside or outside the memory controller 100*a*.

The host interface 130*a* may communicate with the host system 30*a*. Specifically, the host interface 130*a* may receive a request and a logical address from the host system 30*a*. The host interface 130*a* may receive data from the host system 30*a* or transmit data to the host system 30*a*. To this end, the host interface 130*a* may be connected to the host system 30*a* in various methods such as a peripheral component interconnection express (PCIe), a serial advanced technology attachment (SATA), a universal serial bus (USB), a secure digital (SD), a multimedia card (MMC), an embedded MMC (eMMC), a universal flash storage (UFS), an embedded UFS (eUFS), a compact flash (CF), a thunderbolt, an Ethernet, and the like.

The memory interface 140*a* may communicate with the memory device 200*a*. Specifically, the memory interface 140*a* may transmit the program command, the physical address, and data to the memory device 200*a*. The memory interface 140*a* may transmit the read command and the physical address to the memory device 200*a* and may receive data output from the memory device 200*a*. The memory interface 140*a* may transmit the erase command and the physical address to the memory device 200*a*. To this end, the memory interface 140*a* may be connected to the memory device 200*a* through a channel. The memory interface 140*a* may communicate with the memory device 200*a* according to a standard protocol such as an open NAND flash interface (ONFI) or Toggle.

The auxiliary power supply 150*a* may be connected to the host system 30*a* through a connector. The auxiliary power supply 150*a* may periodically check a level of power supplied from the host system 30*a*. The auxiliary power supply 150*a* may supply auxiliary power to the memory system 10*a* when it is determined that a sudden power off (SPO) occurs according to the level of power.

The AES engine 160*a* may encrypt or decrypt data using an AES algorithm. The AES algorithm may be a symmetric key algorithm using the same encryption key in an encryption operation and a decryption operation.

The ECC engine 170*a* may perform an error detection operation and an error correction operation on data. Specifically, the ECC engine 170*a* may generate parity data for data to be stored in the memory device 200*a*. The parity data may be stored in the memory device 200*a* together with the data. When the data stored in the memory device 200*a* and the parity data are received, the ECC engine 170*a* may detect an error of data using the parity data and correct the error when the error of data exists.

The DMA controller 180*a* may directly access the host memory 320*a* of the host system 30*a*. For example, the DMA controller 180*a* may bring data stored in the host memory 320*a* or store data in the host memory 320*a* independently of the host controller 310*a*.

What is claimed is:

1. A memory device comprising:

a memory cell;

a page buffer comprising a latch storing a result of comparing a threshold voltage of the memory cell to a pre-verify voltage and a main verify voltage; and a program operation control circuit configured to control the page buffer to apply a first program control voltage to a bit line connected to the memory cell while a program voltage is applied to a word line connected to the memory cell based on a cumulative number of times, across a plurality of program loops, pass data indicating that the threshold voltage of the memory cell exceeds the pre-verify voltage is sensed by the page buffer;

wherein the page buffer further comprises:

a first pre-sensing latch configured to store pre-verify data indicating whether the threshold voltage of the memory cell exceeds the pre-verify voltage in a first program loop;

a first main sensing latch configured to store main verify data indicating whether the threshold voltage of the memory cell exceeds the main verify voltage in the first program loop;

a second pre-sensing latch configured to store the pre-verify data indicating whether the threshold voltage of the memory cell exceeds the pre-verify voltage in a second program loop; and a second main sensing latch configured to store the main verify data indicating whether the threshold voltage of the memory cell exceeds the main verify voltage in the second program loop.

2. The memory device of claim 1, wherein the program operation control circuit is configured to control the page buffer to apply a program allowable voltage to the bit line in the second program loop when the pass data is sensed by the page buffer in the first program loop.

3. The memory device of claim 2, wherein the program operation control circuit is configured to control the page buffer to apply the first program control voltage to the bit line in a third program loop when the pass data is sensed by the page buffer in the second program loop.

4. The memory device of claim 3, wherein the first program control voltage is greater than the program allowable voltage.

5. The memory device of claim 2, wherein the program allowable voltage is at least of: a ground voltage and a reference potential voltage.

6. The memory device of claim 3, wherein the program operation control circuit is configured to control the page buffer to apply a second program control voltage greater than the first program control voltage to the bit line in a fourth program loop when the pass data is sensed by the page buffer in the third program loop.

7. The memory device of claim 6, wherein the second program control voltage is less than a program inhibit voltage.

8. The memory device of claim 1, wherein the first pre-sensing latch and the second pre-sensing latch store the pass data when the threshold voltage of the memory cell exceeds the pre-verify voltage and store fail data when the threshold voltage of the memory cell is equal to or less than the pre-verify voltage.

9. The memory device of claim 1, wherein the first main sensing latch and the second main sensing latch store the pass data when the threshold voltage of the memory cell exceeds the main verify voltage and store fail data when the threshold voltage of the memory cell is equal to or less than the main verify voltage.

10. The memory device of claim 1, wherein the program operation control circuit performs the plurality of program loops in which a program voltage applied to the word line increases by a step voltage when a program loop count increases.

11. The memory device of claim 10, wherein a difference between the main verify voltage and the pre-verify voltage is greater than the step voltage.

12. A memory device comprising:

a memory cell;

a first pre-sensing latch configured to store data indicating a result of a pre-verify operation on the memory cell in a first program loop;

a second pre-sensing latch configured to store data indicating a result of the pre-verify operation on the memory cell in a second program loop;

a voltage generation circuit configured to generate voltages to be applied to a word line and a bit line connected to the memory cell; and a program operation control circuit configured to control the voltage generation circuit to apply a voltage to a bit line connected to the memory cell in a third program loop according to whether the data stored in the first pre-sensing latch and the second pre-sensing latch match each other;

a first main sensing latch configured to store fail data indicating a fail of a main verify operation on the memory cell in the first program loop; and a second main sensing latch configured to store the fail data indicating the failure of the main verify operation on the memory cell in the second program loop.

13. The memory device of claim 12, wherein the program operation control circuit is configured to control the voltage generation circuit to apply a program control voltage to the bit line in the third program loop when the data stored in the first pre-sensing latch and the second pre-sensing latch match.

14. The memory device of claim 13, wherein the program operation control circuit is configured to control the voltage generation circuit to apply a program allowable voltage to the bit line in the third program loop when the data stored in the first pre-sensing latch and the second pre-sensing latch do not match.

15. The memory device of claim 14, wherein the program control voltage is greater than the program allowable voltage.

16. A method of operating a memory device, the method comprising:

applying a program voltage to a word line connected to a memory cell in a first program loop;

identifying a threshold voltage of the memory cell using a pre-verify voltage in the first program loop; and applying a bit line voltage to a bit line connected to the memory cell in a second program loop based on a cumulative number of times, across a plurality of program loops, the threshold voltage of the memory cell is identified as a threshold voltage greater than the pre-verify voltage;

wherein the memory device comprises:

a page buffer comprising:

a latch storing a result of comparing the threshold voltage of the memory cell to the pre-verify voltage and a main verify voltage;

a first pre-sensing latch configured to store pre-verify data indicating whether the threshold voltage of the memory cell exceeds the pre-verify voltage in the first program loop;

a first main sensing latch configured to store main verify data indicating whether the threshold voltage of the memory cell exceeds the main verify voltage in the first program loop;

a second pre-sensing latch configured to store the pre-verify data indicating whether the threshold voltage of the memory cell exceeds the pre-verify voltage in the second program loop; and a second main sensing latch configured to store the main verify data indicating whether the threshold voltage of the memory cell exceeds the main verify voltage in the second program loop.

17. The method of claim 16, wherein applying the bit line voltage to the bit line in the second program loop further comprises applying a program allowable voltage to the bit line connected to the memory cell of which the threshold voltage is identified as the threshold voltage greater than the pre-verify voltage, in the second program loop.

18. The method of claim 17, wherein applying the program allowable voltage to the bit line in the second program loop comprises applying a program control voltage to the bit line connected to the memory cell of which the threshold voltage is identified as the threshold voltage greater than the pre-verify voltage.

* * * * *